United States Patent [19]
Kodama et al.

[11] Patent Number: 5,898,712
[45] Date of Patent: Apr. 27, 1999

[54] CRC CODE GENERATION CIRCUIT, CODE ERROR DETECTION CIRCUIT, AND CRC CIRCUIT HAVING FUNCTIONS OF BOTH THE CRC CODE GENERATION CIRCUIT AND THE CODE ERROR DETECTION CIRCUIT

[75] Inventors: Yukio Kodama; Kazuo Murakami, both of Tokyo, Japan

[73] Assignee: Mitsubishi Denki Kabushiki Kaisha, Tokyo, Japan

[21] Appl. No.: 08/822,209

[22] Filed: Mar. 21, 1997

[30] Foreign Application Priority Data

Sep. 25, 1996 [JP] Japan .................................... 8-253339

[51] Int. Cl.⁶ .................................................. G06F 11/10
[52] U.S. Cl. ............................................. 371/53; 371/37.6
[58] Field of Search ....................................... 371/53, 37.6

[56] References Cited

U.S. PATENT DOCUMENTS

| | | | |
|---|---|---|---|
| 4,238,852 | 12/1980 | Iga et al. | 371/40 |
| 4,630,271 | 12/1986 | Yamada | 371/37 |
| 4,910,736 | 3/1990 | Tanaka et al. | 371/37.7 |

FOREIGN PATENT DOCUMENTS 0 479 296 A1  4/1992  European Pat. Off. .
61-257803    10/1986  Japan .
63-111730    10/1986  Japan .

*Primary Examiner*—Reba I. Elmore
*Assistant Examiner*—McDieunel Marc
*Attorney, Agent, or Firm*—Leydig, Voit & Mayer

[57] ABSTRACT

When encoding data bits in a CRC code word and "0" information is received for every bit by a dividing circuit, the CRC code word is divided by a generation polynomial and remainder data resulting from the division is output from parallel data output terminals of the dividing circuit. The remainder data is added to a CRC intrinsic value in the adder to produce a sum. The sum is a CRC code in a CRC code word for transmission. When a code error is detected, data having a plurality of bits in a CRC code word and a CRC code are received by the dividing circuit, where they are divided by the generation polynomial and remainder data is output from the respective parallel data terminals. The remainder data is added to the CRC intrinsic value in the adder to produce a sum, and the sum is processed into a logical sum in a logical sum circuit. The logical sum is output as a CRC flag. The present invention provides a CRC code generation circuit for generating a CRC code in a CRC code word at high speed as well as a code error detection circuit for detecting a code error in a CRC code word at high speed.

4 Claims, 10 Drawing Sheets

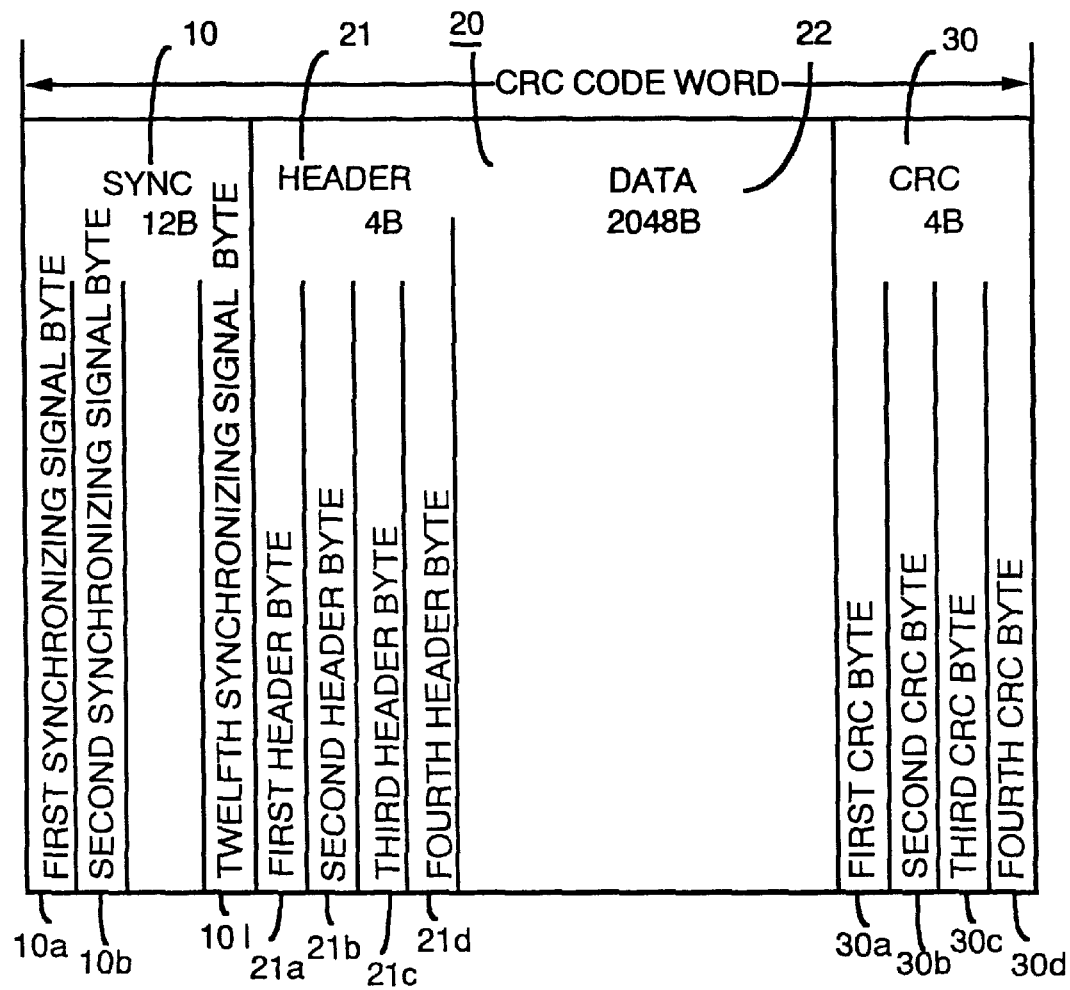
FIG. 5
FIG. 6A
CRC CODE WORD
FIG. 6B
CLOCK SIGNAL clk
FIG. 6C
DATA INPUT SIGNAL enbl

CRC CODE GENERATION CIRCUIT, CODE ERROR DETECTION CIRCUIT, AND CRC CIRCUIT HAVING FUNCTIONS OF BOTH THE CRC CODE GENERATION CIRCUIT AND THE CODE ERROR DETECTION CIRCUIT

BACKGROUND OF THE INVENTION

1. Field of the Invention

The present invention relates to a CRC code generation circuit, a code error detection circuit and a CRC circuit used in CD-ROM MODE 1 or CD-ROM MODE 2, for example, in the field of communication or storage media etc. More specifically, the present invention relates to a CRC code generation circuit for generating a CRC (Cyclic Redundancy Check) code or an EDC (Error Detection Code) code (hereinafter, these codes are referred to in general as an error detection code (CRC code)), a code error detection circuit for detecting an error using the CRC code, and a CRC circuit which functions both as a CRC code generation circuit and a code error detection circuit.

2. Description of the Prior Art

A CRC code word use in CD-ROM MODE 1 consists of a fixed pattern for synchronization, data following this pattern, and an error detection code (CRC code) which is added to the fixed pattern and the data. Japanese Patent publication No. 4-81896 discloses a decode error detection circuit for detecting a code error, in which the CRC code word mentioned above is regarded as one block.

The error detection circuit disclosed in the above-mentioned reference comprises a dividing circuit consisting of a shift register to which data in a CRC code word and CRC code are inputted, a NOR circuit which receives a result output from the dividing circuit and outputs a signal indicating "no error" when all the bits in the result from the dividing circuit are "0" and a signal indicating "error" when even one bit is "1", and an initial setting circuit for setting the initial state of a register constituting the dividing circuit to the same state as that is obtained when the fixed pattern of the CRC code is inputted sequentially.

SUMMARY OF THE INVENTION

An object of the invention is to provide a CRC code generation circuit for generating a CRC code for a CRC code word at a high speed according to data in the CRC code word.

Another object of the invention is to provide a CRC code generation circuit for generating a CRC code for a CRC code word at high speed and accurately, although the CRC code word is inputted in synchronization with a clock signal, but the data is inputted intermittently, i.e. the next data is not inputted in every clock of the clock pulse signal.

Another object of the invention is to provide a CRC code generation circuit for outputting the CRC code serially.

Another object of the invention is to provide a code error detection circuit for detecting a code error in a CRC code word at a high speed.

Another object of the invention is to provide a code error detection circuit for detecting a code error in a CRC code word at high speed and accurately, even if the CRC data is inputted intermittently.

Another object of the invention is to provide a code error detection circuit for outputting a decoded CRC code for a CRC code word when the CRC code word contains an error.

Another object of the invention is to provide a CRC circuit for generating a CRC code in a CRC code word and detecting a code error in the CRC code word at a high speed.

Another object of the invention is to provide a CRC circuit for generating a CRC code in a CRC code word at a high speed accurately and detecting a code error in the CRC code word at a high speed, accurately, even if the data is inputted intermittently.

Another object of the invention is to provide a CRC circuit for outputting the CRC code serially.

A further object of the invention is to provide a CRC circuit for outputting a decoded CRC code in a CRC code word if the CRC code word contains an error.

According to one aspect of the invention, a CRC code generation circuit used for CRC code word comprises a dividing circuit and an adder.

The dividing circuit wherein, a data of a plurality of bits in a CRC code word and "0" information of r (integer equal to or more than 2) bits are inputted from a data input terminal, the CRC code word comprises a fixed pattern of a plurality of bits and a CRC code of r bits other than the data of a plurality of bits, the inputted data and the "0" information are divided according to a generation polynomial g(X) of a CRC code word, and a data of a remainder as a result of the division is outputted as a remainder data of r bits.

The adder adds the remainder data from the dividing circuit and an intrinsic value (CRC intrinsic value) of r bits which is respectively derived from a fixed pattern in the CRC code word and the number of the CRC code word except the fixed pattern, and outputs an addition result as an encoded CRC code in the CRC code word for a data inputted into the dividing circuit.

According to another aspect of the invention, a code error detection circuit for detecting a code error in a CRC code word comprises a dividing circuit and a flag output circuit.

The dividing circuit receives a data of a plurality of bits in a CRC code word and a CRC code of r bits inputted from a data input terminal, dividing the inputted CRC code word by a generation polynomial g(X) of a CRC code word, and outputs a result of said division from r parallel data output terminals as a remainder data of r bits.

The flag output circuit outputs a CRC flag indicating right/error of said CRC code word for a data inputted into the dividing circuit according to the remainder data from the dividing circuit and the CRC intrinsic value.

According to further aspect of the invention, a CRC circuit which operates as a CRC code generation circuit and a code error detection circuit comprises a dividing circuit, an adder and a logical sum circuit.

When encoding, the dividing circuit receives a data of a plurality of bits in a CRC code word and "0" information of r bits inputted from a data input terminal, divides the inputted data and the "0" information by a generation polynomial g(X) of a CRC code word, and outputs a result of said division from r parallel data output terminals as a remainder data of r bits.

When a code error is detected, the dividing circuit receives a data of a plurality of bits and a CRC code of r bits in a CRC code word inputted from a data input terminal, divides the inputted CRC code word by a generation polynomial g(X) of a CRC code word, and outputs a data of a remainder as a result of the division from a plurality of r parallel data output terminals as a remainder data of r bits.

The adder adds the remainder data from r parallel data output terminals of the dividing circuit and a CRC intrinsic value, and when encoding, outputs the addition result as an encoded CRC code in the CRC code word for a data inputted into the data input terminal of the dividing circuit.

The logical sum circuit calculates a logical sum of an addition result from the adder to output the calculation result as a CRC flag when a code error is detected.

According to further aspect of the invention, a CRC circuit which operates as a CRC code generation circuit and a code error detection circuit comprises a dividing circuit, an adder and a comparator.

When encoding, the dividing circuit receives a data of a plurality of bits in a CRC code word and "0" information of r bits inputted from a data input terminal, divides the inputted data and the "0" information by a generation polynomial g(X) of a CRC code word, and outputs a result of said division from r parallel data output terminals as a remainder data of r bits.

When a code error is detected, the dividing circuit receives a data of a plurality of bits and a CRC code of r bits in a CRC code word inputted from a data input terminal, divides the inputted CRC code word by a generation polynomial g(X) of a CRC code word, and outputs a data of a remainder as a result of the division from a plurality of r parallel data output terminals as a remainder data of r bits.

The adder adds the remainder data from the serial data output terminal of the dividing circuit and a CRC intrinsic value for every bit, and when encoding, the adder serially outputs the addition result for every bit as an encoded CRC code in the CRC code word for a data inputted into the data input terminal of the dividing circuit.

The comparator compares the CRC intrinsic value and a remainder data from the dividing circuit to output the comparison result as a CRC flag, when a code error is detected.

According to still further aspect of the invention, a CRC circuit which operates as a CRC code generation circuit and a code error detection circuit comprises a dividing means, an adder and a flag output means, an input-side logic circuit, a first switching means.

The dividing circuit which comprises a data input terminals, a serial data output terminal for serially outputting a remainder data of a plurality of bits for every bit, said remainder data is calculated by multiplying a CRC code word at least except a fixed pattern inputted from the data input terminal by $X^r$, then dividing the multiplied value by a generation polynomial g(X) of a CRC code word, a plurality of parallel data output terminals for outputting the remainder data of a plurality of bits in parallel, and a plurality of stages of storage means corresponding to one of the plurality of parallel data output terminals.

The adder adds the remainder data from the serial data output terminal of the dividing circuit and a CRC intrinsic value for every bit. When encoding, the adder outputs the addition result for every bit as an encoded CRC code in the CRC code word for a data inputted into the data input terminal of the dividing circuit.

The flag output means outputs a CRC flag indicating right/error of a CRC code word inputted from the second data input terminal of the dividing circuit when a code error is detected, according to the remainder data from the respective parallel data output terminals of the dividing circuit and the CRC intrinsic value.

The plurality of respective storage means are classified to either a first group or a second group according to the generation polynomial g(X) of the CRC code word.

Each of said storage means in the first group comprises a first input node, a second input node and an output node which is connected to corresponding one of the parallel data output terminals; a logic circuit for calculating an exclusive logical sum between the data inputted respectively to the first and second input nodes; and a storage portion comprising an input node A0 for receiving an output from the logic circuit, an input node B0, an output node C0, and a selective input node, and a selector for outputting either a data inputted from the input node A0 or a data inputted from the input node B0 to the output node C0 according to a data input control signal inputted to the selective input node, and a storing circuit for receiving an output from the output node C0 of the selector in synchronization with an inputted clock signal, for storing the received content, and for outputting the content to the output node and the input node B0 of the selector.

Each of said storage means classified to the second group comprises: a first input node and an output node which is connected to corresponding one of the parallel data output terminals; a storage portion comprising an input node A0 for receiving a data inputted in the first node, an input node B0, an output node C0, and a selective input node, and a selector for outputting either a data inputted from the input node A0 or a data inputted from the input node B0 to the output node C0 according to a data input control signal inputted to the selective input node, and a storing circuit for receiving an output from the output node C0 of the selector in synchronization with an inputted clock signal, for storing the received content, and for outputting the content to the output node and the input node B0 of the selector.

The first input node of the first-stage storage circuit is connected to the data input terminal, said first input node of each remaining stage of the storage circuit is connected to an output node of the storage circuit in the preceding stage, and the output node of the last-stage storage circuit is connected to the serial data output terminal.

The first switching means arranged between the output node of the last-stage storage circuit and the second input nodes of the respective storage circuit classified to the first group, is connected to the output node of the last-stage storage circuit and the second input nodes of the respective storage circuit classified to the first group while the dividing circuit performs division operation, and for providing "0" information with the second input nodes of the respective storage circuit classified to the first group when a remainder data is outputted from the serial data output terminal.

BRIEF DESCRIPTION OF THE DRAWINGS

FIG. 5 is a diagram showing a construction of a CRC code word shown in FIG. 4.

FIG. 6 is a simplified timing diagram for explaining the relationship between the CRC code word, the clock signal "clk", and the data input control signal "enbl" according to the first and the third embodiments of the present invention.

DETAILED DESCRIPTION OF THE PREFERRED EMBODIMENTS

Embodiment 1

A first embodiment of the present invention is explained using FIG. 1~FIG. 6. Before explaining a CRC circuit of the first embodiment which operates as a CRC code generation circuit and also as a code error detection circuit, a CRC code word which is used in the CD-ROM MODE 1 in this first embodiment is explained, using FIG. 4 and FIG. 5. The output from a dividing circuit in the CRC circuit of the first embodiment comprises 32 bits, for example.

Figure 4:
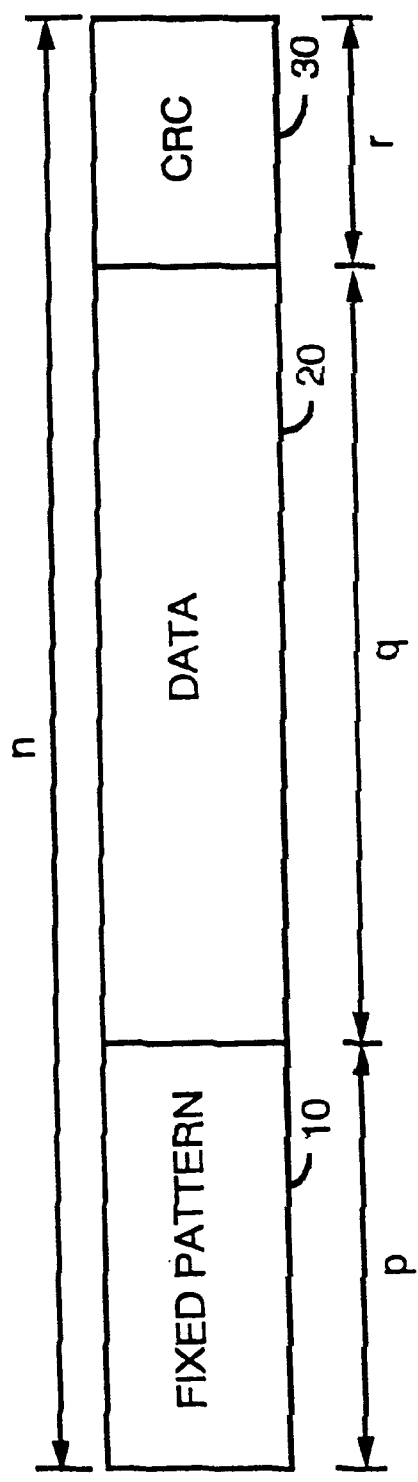
FIG. 4 is a data format diagram showing a CRC code word in the CD-ROM MODE 1 applied to the present invention.

In FIG. 4, a fixed pattern 10 for synchronization has a fixed value data length p. As shown more specifically in FIG. 5, the fixed pattern 10 comprises twelve synchronizing signal bytes 10a, 10b, ... , 10l, each byte consisting of 8 bits. This fixed pattern 10 is transmitted in the order from the first synchronizing signal byte 10a to the 12th synchronization signal byte 10l, and each is transmitted in the order from 0th bit, i.e. a least significant bit (LSB) to the seventh bit, i.e. a most significant bit (MSB).

Data 20 has an information data length q. As shown more specifically in FIG. 5, the data 20 consists of a header portion 21 and a data portion 22. The header portion 21 comprises 4 header bytes 21a, 21b, ... , 21d, each byte comprising 8 bits. The data portion 22 comprises 2048 bytes, each byte comprising 8 bits. The data 20 is transmitted after the synchronizing signal 10 in the order from the header portion 21 to the data portion 22. The header portion 21 is transmitted in the order from the first header byte 21a to the fourth header byte 21d, and each byte is transmitted from the 0th bit to the seventh bit. The data portion 22 is transmitted in the order from the first byte to the 2048th byte, and each byte is transmitted in the order from the 0th bit to the seventh bit.

A CRC code 30 has of a CRC code length r. As shown more specifically in FIG. 5, the CRC code 30 comprises four-bytes CRC codes, each byte comprising 8 bits. This CRC code 30a is constructed so that the CRC code word will cause the division result to be zero using the fixed pattern 10 and the data 20. This CRC code 30 is transmitted after the data 20 in the order from the first CRC detection signal byte 30a to the fourth CRC detection signal byte 30d, and each byte is transmitted from the 0th bit to the seventh bit.

The CRC code word, comprising the fixed pattern 10, the data 20 and the CRC code 30, has a code word length n (=p+q+r) in the CD-ROM MODE 1.

The CRC code constituted in this way satisfies the following conditional equation. In other words, the polynomial g(x) of the CRC code word defined in a technical standard is obtained so that the remainder is zero when the transmission code word polynomial T(x) of the CRC code word is divided by the polynomial g(x), as shown by a following equation (1).

$$g(X)=X^{32}+X^{31}+X^{16}+X^{15}+X^{4}+X^{3}+1 \quad (1)$$

On the other hand, the transmission code word polynomial T(x) of the CRC code word is shown by a following equation (2).

$$T(X)=F(X).X^{(q+r)}+I_1(X).X^r+C_1(X) \quad (2)$$

where, F(X) is a fixed pattern polynomial, $I_1(X)$ is a data polynomial, and $C_1(X)$ is a CRC code polynomial, n is a code word length, p is a fixed data length, q is an information data length, and r is CRC code length.

Since the above-mentioned T(X) is shown by a following equation (3), the equation (2) is shown by equation (4).

$$T(X) \bmod g(X)=0 \quad (3)$$

$$\{F(X).X^{(q+r)}+I_1(X).X^r+C_1(X)\} \bmod g(X)=0 \quad (4)$$

The above-mentioned equation (3) shows that the remainder is zero when the transmission code word polynomial T(X) is divided by the generation polynomial g(X).

The following equations (5) and (6) are transformations of equation (4), and as a result of the transformations, equation (7) is obtained.

$$\{F(X).X^{(q+r)}+I_1(X).X^r\} \bmod g(X)+C_1(X) \bmod g(X)=0 \quad (5)$$

$$C_1(X) \bmod g(X)=\{F(X).X^{(q+r)}+I_1(X).X^r\} \bmod g(X) \quad (6)$$

$$C_1(X) \bmod g(X)=F(X).X^{(q+r)} \bmod g(X)+I_1(X).X^r \bmod g(X) \quad (7)$$

As is clear from the equation (7), the left member $[C_1(X) \bmod g(X)]$ of the equation (7) represents a CRC code in a CRC code word for transmission.

The first term $[F(X).X^{(q+r)} \bmod g(X)]$ in the right member of equation (7) represents an intrinsic value derived from the fixed pattern 10 and a code length (the number of bits) (q+r) in a CRC code word except the fixed pattern (hereinafter, referred to as a CRC intrinsic value).

The second term $[I_1(X).X^r \bmod g(X)]$ in the right member of equation (7) represents a remainder resulting from dividing the product of the information data polynomial $I_1(X)$ and $X^r$, by the CRC generation polynomial g(X), in other words, a remainder of the data. In other words, the second term in the right member of the equation (7) represents the remainder data obtained by dividing the data in the CRC code word and the "0" data having the same number of bits as the code length r of the CRC code, by the CRC generation polynomial g(X).

Accordingly, the CRC code for the CRC code word for transmission is obtained by multiplying the CRC code word data by $X^r$ to produce a product, then dividing the product by the CRC generation polynomial g(X), and adding a CRC intrinsic value to the division result (a remainder of the data).

Since the CRC intrinsic value comprises respective standardized values for the fixed pattern 10 and the respective code lengths p, q and r, in a CRC code word, the CRC intrinsic value has a predetermined value, for example, 32 bits as same as the code length r of the CRC code in this first embodiment, regardless to the content in the data 20.

On the other hand the received code word polynomial R(X) of a CRC code word is shown by a following equation (8).

$$R(X)=F(X).X^{(q+r)}+I_2(X).X^r+C_2(X) \quad (8)$$

a where, F(X) is a fixed pattern polynomial, $I_2(X)$ is a data polynomial, $C_2(X)$ is a CRC code polynomial, n is a code word length, p is a fixed data length, q is an information data length, and r is a CRC code length.

A decoded CRC code of the CRC code word is obtained by dividing the received code word polynomial R(X) by the generation polynomial g(X) of the CRC code word. Assuming the decoded CRC code polynomial of decoded CRC code is DC(X), the following equation (9) is obtained.

Since the generation polynomial g(X) for the standardized CRC code word is defined so that the remainder obtained by dividing the received code word polynomial R(X) of the CRC code by the generation polynomial g(X) is zero, the decoded CRC code polynomial DC(X) becomes zero if there is no error in the received CRC code word.

$$DC(X)=R(X) \bmod g(X) \quad (9)$$

The following equation (10) is obtained by substituting the equation (8) for equation (9). Equation (11) and equation (12) are obtained by transforming the equation (10).

$$DC(X)=\{F(X).X^{(q+r)}+I_2(X).X^r+C_2(X)\} \bmod g(X) \quad (10)$$

$$DC(X)=F(X).X^{(q+r)} \bmod g(X)+\{I_2(X).X^r+C_2(X)\} \bmod g(X) \quad (11)$$

$$DC(X)=F(X).X^{(q+r)} \bmod g(X)+I_2(X).X^r \bmod g(X)+ C_2(X) \bmod g(X) \quad (12)$$

As is clear from equation (11), the first term $[F(X).X^{(q+r)} \bmod g(X)]$ in the right member of the equation (11) represents an intrinsic value (hereinafter, referred to as a CRC intrinsic value) derived from the fixed pattern 10 and a code length (the number of bits) (q+r) in a CRC code word except the fixed pattern.

The second term $[\{I_2(X).X^r+C_2(X)\} \bmod g(X)]$ in the right member of the equation (11) represents a remainder obtained by dividing the CRC code word, except the fixed pattern 10, by the CRC generation polynomial g(X), i.e. a remainder of the data.

Accordingly, the decoded CRC code polynomial DC(X) for the decoded CRC code in the received CRC code word is obtained by dividing the CRC code word, except the fixed pattern 10, by the CRC generation polynomial g(X), and adding the CRC intrinsic value to the division result (a remainder of the data).

If there is no error in the received CRC code word, the decoded CRC code polynomial DC(X) is zero, and the addition of the division result of the CRC code word except the fixed pattern 10 (the remainder of the data), to the CRC intrinsic value is zero. In other words, the result obtained by dividing the CRC code word, except the fixed pattern 10 (the remainder of the data), by the CRC generation polynomial g(X) has the same value as the CRC intrinsic value.

As is clear from the equation (12), the first term $[F(X).X^{(q+r)} \bmod g(X)]$ in the right member of equation (12) represents a CRC intrinsic value.

The second term $[\{I_2(X).X^r \bmod g(X)\}]$ in the right member of the equation (12) represents the remainder resulting from of dividing the product of the information data polynomial $I_1(X)$ and $X^r$, by the CRC generation polynomial g(X).

The third term $[C2(X) \bmod g(X)]$ in the equation (12) represents a CRC code itself in the received CRC code word.

Accordingly, the decoded CRC code polynomial DC(X) for the decoded CRC code in the received CRC code word is obtained by multiplying the CRC code word data by $X^r$, then dividing the multiplied result by the CRC generation polynomial g(X), and adding a CRC intrinsic value and the CRC code in the received CRC code word to the divided result (a remainder of the data).

If there is no error in the received CRC code word, the decoded CRC code polynomial DC(X) is zero, and the addition of the result (a remainder of the data), which is obtained by dividing the product of the received CRC code word data and $X^r$ by the CRC generation polynomial g(X), the CRC intrinsic value, and the CRC code in the received CRC code word is zero.

Figure 1:
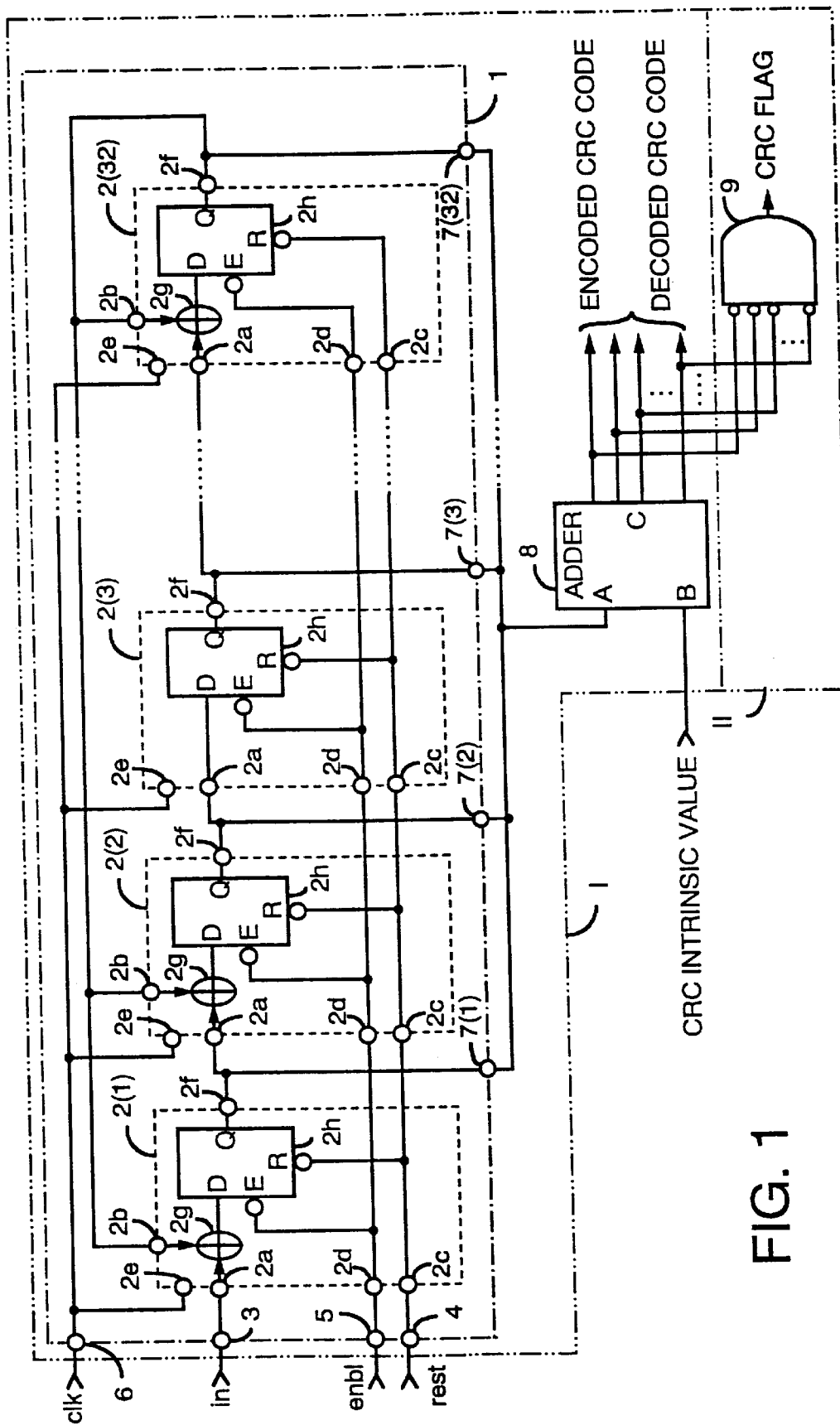
FIG. 1 is a circuit configuration diagram showing a first embodiment of the present invention.
Figure 2:
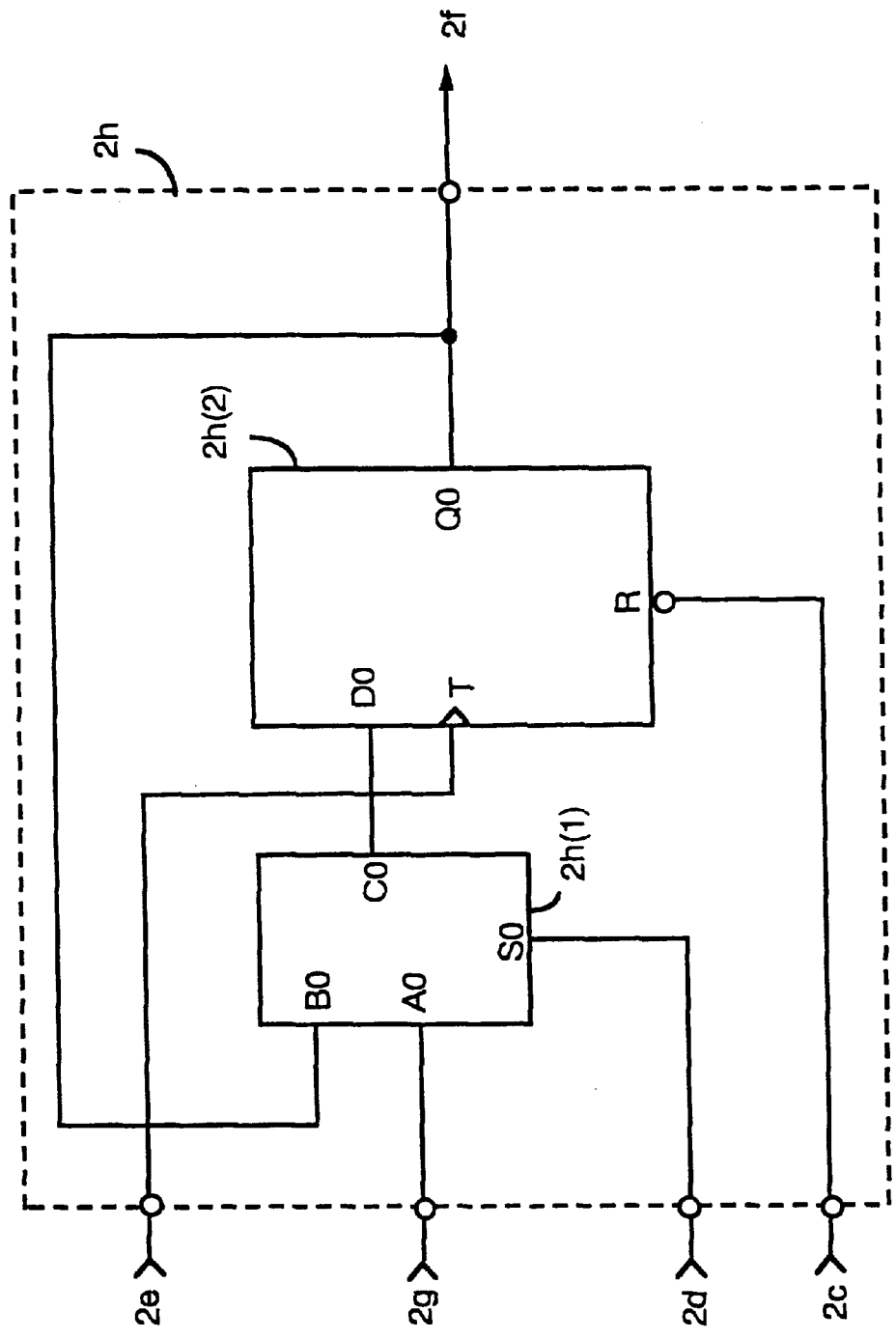
FIG. 2 is a block diagram showing a storage portion 2h in each of the storage devices 2(1)~2(32) according to the first and third embodiments of the present invention.

A CRC circuit which operates as a CRC code generation circuit for generating the CRC code word and a code error detection circuit for detecting a code error in the CRC code word is explained, referring to FIG. 1 and FIG. 2.

Figure 3:
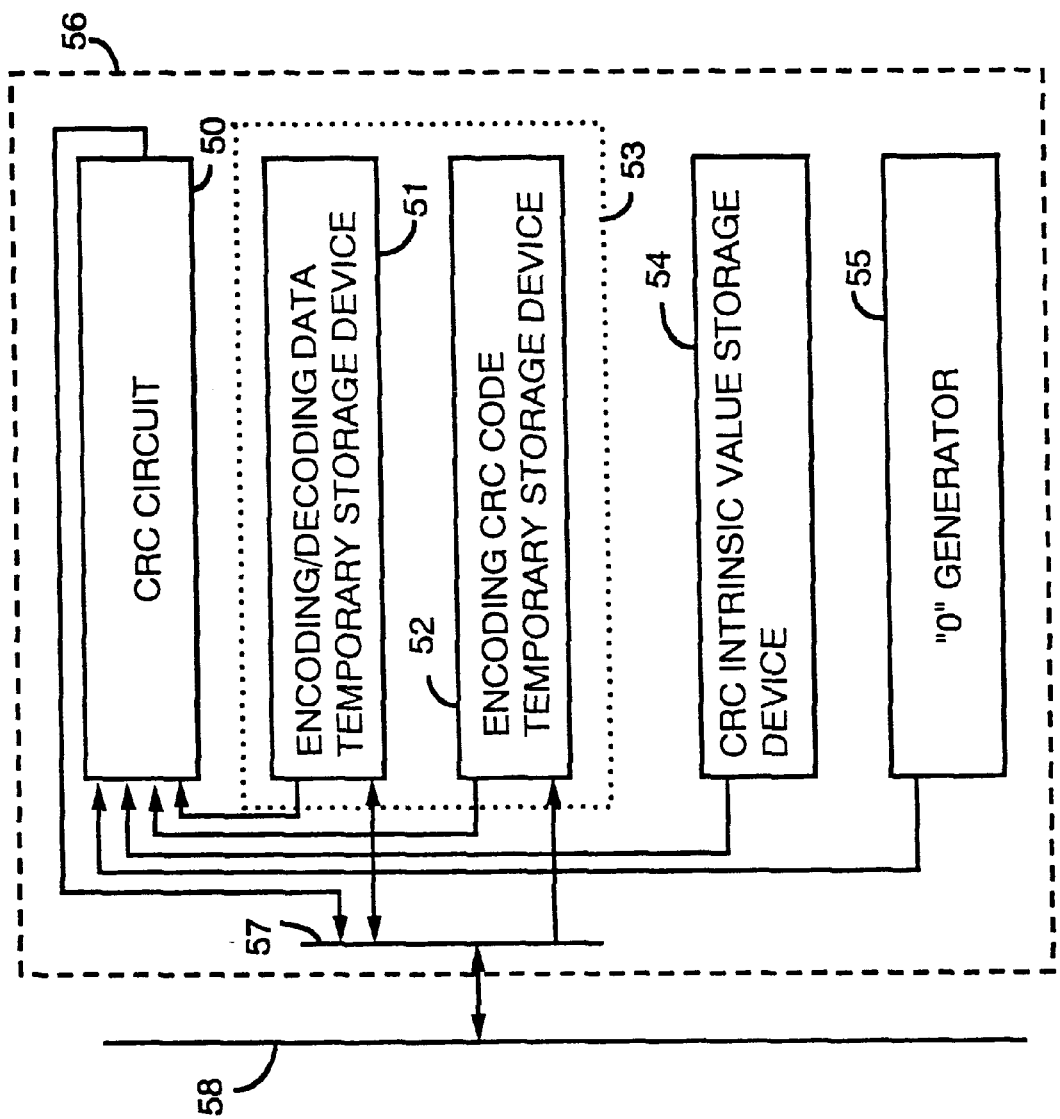
FIG. 3 is a block diagram showing an encoding/decoding system to which a CRC circuit shown in each of the embodiments of the present invention is applied.

FIG. 1 is a circuit configuration of a dividing circuit 1. In FIG. 1, during encoding process, a CRC code word having a plurality of bits (hereinafter, referred to as an encoding input data in the first embodiment), comprising a fixed pattern having a plurality (p) of bits, data having a plurality (q) of bits, and a CRC code having a plurality (r, any integer greater than or equal to 2) of bits as shown in FIG. 3 and FIG. 4, and "0" information of r bits (hereinafter, referred to as an encoding input data in the first embodiment) are inputted from a code data input terminal 3 for every bit width. The dividing circuit divides the inputted data and "0" information by the generation polynomial g(X) (see equation (1)) of the CRC code word, and outputs the remainder of data as resulting the division as remainder data of r bits from parallel data output terminals 7(1)~7(32). When a code error is detected, data having a plurality of bits in the CRC code word and a CRC code having r bits (hereinafter, referred to an input data at an error detection in the first embodiment) are inputted from a code data input terminal 3. The dividing circuit 1 then divides the inputted CRC code word by the generation polynomial g(X) of the CRC code word, and outputs the remainder data of the division result as r bits of remainder data from parallel data output terminals 7(1)~7(32).

The dividing circuit 1 further comprises the first and second input terminals 3a, 3b, and the parallel data output terminals 7(1)~7(32) as explained above. The dividing circuit 1 further comprises a reset signal input terminal 4 to which a reset signal "rest" for setting all the stored contents in the storage devices 2(1)~2(32) to the initial state, for example "0", is inputted. The dividing circuit 1 further comprises a data input control terminal 5 to which a data input control signal (enable signal) "enbl" indicating whether the storage devices 2(1)~2(32) operate as a shift register or as a storage device for maintaining data stored therein. The dividing circuit 1 further comprises a clock signal input terminal 6 to which a clock signal "clk" for deciding the timing to take in the content to be stored in the storage devices 2(1)~2(32).

In this first embodiment, the encoding input data and the error detection input data are inputted to the code data input terminal 3 in synchronization with the clock signal "clk" as shown in FIG. 6B. The data is provided for every bit in the order of the 0th, the first, and the second bit, as shown in FIG. 6A. As shown in FIG. 6A and FIG. 6B, the respective 0th, first, fourth and fifth bits are provided respectively within one clock period of the clock signal "clk", and the second and third bits are provided respectively within two clock periods of the clock signal "clk". However, the second bit data is not provided in the second clock period of the clock signal "clk" during the second and third bits. In other words, the data is dropped out in this second clock period. In the present application, such data is referred to as intermittent data.

In this first embodiment, if the encoding input data inputted to the first input terminal 3 or the error detection input data inputted to the input terminal 3 is intermittent data as mentioned above, an "H"-level data input control signal "enbl" is provided to the data input control terminal 5 during the second clock period of the clock signal "clk" for the second and the third bits, as shown in FIG. 6C, indicating that data is dropped during this period.

The storage devices 2(1)~2(32) in a plurality of stages, which comprises the dividing circuit 1, are classified into a first and a second group, according to the generation polynomial g(X) of a CRC code word as shown by the equation (1). In this first embodiment, the seventh storage devices in the respective first, second, fourth, fifth, sixteenth, seventeenth, and thirty second stages belong to the first group, and the storage devices in the other 25 stages belong to the second group.

Each of the storage devices belonging to the first group comprises first and second input nodes 2a, 2b, a reset signal input node 2c which is connected to the above mentioned reset signal input terminal 4, a data input control node 2d which is connected to the above-mentioned data input control terminal 5, a clock signal input node 2e which is connected to the above-mentioned clock signal input terminal 6, an output node 2f which is connected to the corresponding parallel data output terminals 7(1)~7(32), a logic means 2g consisting of an exclusive OR circuit for calculating an exclusive logical sum of the data respectively inputted into the first and the second input nodes 2a, 2b, and a storage portion 2h.

The storage portion 2h is reset by a reset signal "rest" which is inputted into the reset signal input node 2d (in this first embodiment, the storage content becomes "0" ("L"level) by an "L"-level of the reset signal "rest"), and it is activated by an "H"-level of the reset signal "rest". In an activated state, if the data input control signal "enbl" which is inputted into the data input control node 2d indicates that the storage portion 2h operates as a shift register (in this first embodiment, it is in "L" level), the storage portion 2h constitutes a shift register, and in synchronization with the clock signal "clk" (in this first embodiment, in response to the rising of the clock signal "clk"), the storage portion 2h takes-in a calculated output from the logic means 2g, temporarily stores it, and then outputs the stored content to the output node 2f. If the data control input signal "enbl" indicates that the storage portion 2h maintains the data (in this first embodiment, it is in "H" level), the storage portion 2h maintains the data, and in synchronization with the clock signal "clk" (in this first embodiment, in response to the edge of the clock signal "clk"), the storage portion 2h receives its the own output, temporarily stores the output, and then outputs the stored content to the output node 2f.

Each of the storage devices belonging to the second group comprises a first input node 2a, a reset signal input node 2c which is connected to the reset signal input terminal 4, a data input control node 2d which is connected to the data input control terminal 5, a clock signal input node 2e which is connected to the clock signal input terminal 6, an output node 2f which is connected to the corresponding parallel data output terminals 7(1)~7(32), and a storage portion 2h.

The storage portion 2h is reset by a reset signal "rest" which is inputted into the reset signal input node 2d (in this first embodiment, the storage content becomes "0" ("L" level) by an "L"-level of the reset signal "rest"), and it is activated by an"H"-level of the reset signal "rest". In an activated state, if the data input control signal "enbl" which is inputted into the data input control node 2d indicates that the storage portion 2h operates as a shift register (in this first embodiment, it is in "L" level), the storage portion 2h constitutes a shift register, and in synchronization with the clock signal "clk" (in this first embodiment, in response to the rising of the clock signal "clk"), the storage portion 2h takes-in a calculated output from the first input node 2a, temporarily stores it, and then outputs the stored content to the output node 2f. If the data control input signal "enbl" indicates that the storage portion 2h maintains the data (in this first embodiment, it is in "H" level), the storage portion 2h maintains the data, and in synchronization with the clock signal "clk" (in this first embodiment, in response to the rising of the clock signal "clk"), the storage portion 2h takes-in the own output, temporarily stores the output, and then outputs the stored content to the output node 2f.

The first input node 2a of the first-stage storage device 2(1) is connected to the code data input terminal 3, and the respective first input nodes 2a of the storage devices 2(2)~2(32) in the second~thirty second stages are connected to the respective output nodes 2f of the storage devices 2(1)~2(31) in the respective preceding stage. The respective second input nodes 2b of the storage device belonging to the first group, i.e. the seven storage devices 2(1), 2(2), 2(4), 2(5), 2(16), 2(17), and 2(32) in the respective first, second, fourth, fifth, sixteenth, seventeenth, and thirty second stages in this first embodiment, are connected to the output node 2f of the storage devices (32) of the last stage.

The respective storage portions 2h of the storage devices 2(1)~2(32) comprise a selector 2h(1) and a flip flop circuit 2h(2) which operates as a storing circuit, as shown in FIG. 2.

The selector 2h(1) in each of the storage devices belonging to the first group comprises a first input node A0 for receiving an output from the logic circuit 2g, a second input node B0, an output node C0, a select input node S0 which is connected to the data input control node 2d. In this first embodiment, if the data input control signal "enbl" which is inputted into the select input node S0 is "L" level, the data which is inputted into the first input node A0 is outputted to the output node C0, and if the data input control signal "enbl" which is inputted into the select input node S0 is "H" level, the data which is inputted into the first input node B0 is outputted to the output node C0.

The selector 2h(1) in each of the storage device belonging to the second group comprises a first input node A0 for receiving a data which is inputted into the first input node 2a, a second input node B0, an output node C0, a select input node S0 which is connected to the data input control node 2d. In this first embodiment, if the data input control signal "enbl" which is inputted into the select input node S0 is "L" level, the data which is inputted into the first input node A0 is outputted to the output node C0, and if the data input control signal "enbl" which is inputted into the select input node S0 is "H" level, the data which is inputted into the first input node B0 is outputted to the output node C0.

The flip flop circuit 2h(2) comprises an input node D0 which is connected to the output node C0 of the selector 2h(1), an output node Q0 which is connected both to the output node 2f and the input node B0 of the selector 2h(1), a reset signal input node R which is connected to the reset signal input node 2c, and a clock signal input node T which is connected to the clock signal input node 2e. In this first embodiment, if the reset signal is "L level, the stored content in the flip flop circuit 2h(2) becomes "0", and if the reset signal is "H" level, the flip flop circuit 2h(2) is activated. In the activated state, the flip flop circuit 2h(2) receives the selected output from the selector 2h(1) into the input node D0 in response to the rising edge of the clock signal "clk", temporarily stores it, and then outputs the stored content to the output node 2f via the output node Q.

Referring back to FIG. 1, an adder 8 adds the remainder data from the respective r parallel data output terminals 7(1)~7(32) in the dividing circuit 1 and the above-mentioned CRC intrinsic value. When encoding, the adder 8 outputs the sum as an encoded CRC code in the CRC code word for the data inputted to the code data input terminal 3 of the dividing circuit 1 (hereinafter, just referred to as an encoded CRC code). When a code error is detected, the adder 8 outputs the sum as a decoded CRC code in the CRC code word for the data inputted from the code data input terminal 3 of the dividing circuit 1 (hereinafter, just referred to as a decoded CRC code).

The adder 8 comprises a first input terminal A for receiving the remainder data (in this first embodiment, 32-bit remainder data) which is outputted from the respective parallel data output terminals 7(1)~7(32) of the dividing circuit 1, a second input terminal B for receiving the above-mentioned CRC intrinsic value (in this first embodiment, a 32-bit data), and an output terminal C for outputting both the sum and a decoded CRC code, which is also an sum.

When encoding, since encoding input data having a plurality of bits consisting having a data of a plurality having bits and "0" information of r bits are inputted to the code data input terminal 3 of the dividing circuit 1, the remainder data from each of the parallel data output terminals 7(1)~7(32) of the dividing circuit 1 is expressed by the second term $[I^1(X).X^r \bmod g(X)]$ in the right member of equation (7).

Accordingly, the remainder data from the parallel data output terminals 7(1)~7(32) and the CRC intrinsic value which is expressed by the first term $[F(X).X^{(q+r)} \bmod g(X)]$ of the right member of the equation (7), are inputted into the adder 8. The first term $[C_1(X) \bmod g(X)]$ of the left member of the equation (7) is outputted from the output terminal of the adder 8, which indicates a CRC code in the CRC code word for transmission (an encoded CRC code).

When a code error is detected, since an error detection input data, consisting of data having a plurality of bits and a CRC code of r bits, is inputted to the code data input terminal 3 of the dividing circuit 1, the remainder data from each of the parallel data output terminals 7(1)~7(32) of the dividing circuit 1 is expressed by the second term $[\{I_2(X).X^r + C_2(X)\} \bmod g(X)]$ in the right member of equation (11).

Accordingly, the remainder data from the parallel data output terminals 7(1)~7(32) and the CRC intrinsic value which is expressed by the first term $[F(X).X^{(q+r)} \bmod g(X)]$ of the right member of equation (11), are inputted into the adder 8. The DC(X) of the left member of equation (11) is outputted from the output terminal of the adder 8, which indicates a decoded CRC code in the received CRC code word (a decoded CRC code).

A logical sum circuit 9 receives a sum from the output terminal of the adder 8, calculates a logical sum of the received sums, and then outputs a logical sum as a CRC flag. The logical sum circuit 9 and the adder comprise a flag output means for outputting a CRC flag which indicates the correct CRC code word or an error in the CRC code word for the data inputted to the dividing circuit 1, according to the remainder data and the CRC intrinsic value from the dividing circuit 1.

The output from logical sum circuit 9 outputs an "H"-level CRC flag in this first embodiment, indicating that the CRC code word comprises no error, when the decoded CRC code polynomial DC (X) is 0, in other words, the sum from the adder 8 is 0, which indicates the received CRC code word comprises no error. If there is an error, the output logical sum circuit 9 outputs an "L"-level CRC flag (a comparison result signal) which means that the CRC code word comprises an error in this first embodiment, since at least one bit in the sum from the adder 8 is 1.

The dividing circuit 1 and the adder 8 comprise a CRC code generation circuit I, and the dividing circuit 1, the adder 8 and the logical sum circuit 9 comprise a code error detection circuit II.

A CRC circuit having a configuration as mentioned above is integrated into an encoding/decoding system, as shown in FIG. 3.

In FIG. 3, a CRC circuit 50 is the same as that shown in detail in FIG. 1. An encoding/decoding data temporary storage device 51 stores data having a plurality of bits in the CRC code word, which is transmitted to the CRC circuit 50. A fixed pattern having a plurality of bits and a CRC code of a plurality having bits generated in the CRC circuit 50 are synthesized into CRC code word, and then transmitted to the other systems via an internal bus 57 and an external bus 58, when encoding. The encoding/decoding data temporary storage device 51 stores having a plurality of bits in the encoding/decoding data temporary storage device, which is inputted via the external bus 58 and the internal bus 57, and transmits the stored data to the CRC circuit 50, when detecting an error code.

An encoding CRC code temporary storage device 52 stores a CRC code having a plurality of bits in the CRC code word which is inputted via the external bus 58 and the internal bus 57, and transmits the stored data to the CRC circuit 50. The encoding/decoding data temporary storage device 51 and the encoding CRC code temporary storage device 52 constitutes a CRC code word storage device 53, which comprise a DRAM, an SRAM, a FIFO etc.

A CRC intrinsic value storage device 54 stores the CRC intrinsic value, and transmits the CRC intrinsic value to the CRC circuit 50. The CRC intrinsic value storage device 54 is able to output in parallel the CRC intrinsic value having a plurality of bits (in this first embodiment, 32 bits), and consists of a ROM which can store the CRC intrinsic value in a "setable" state.

A "0" generator 55 transmits "0" information which consists of a plurality of bits (in this first embodiment, 32 bits) to the CRC circuit 50. In synchronization with a clock signal which is inputted to the CRC circuit 50, the "0" generator 55 outputs a plurality of "L"-level bits (in this first embodiment, an earth potential).

An encoding/decoding system 56 comprises the CRC circuit 50, the encoding/decoding data temporary storage device 51, the encoding CRC code temporary storage device 52, the CRC intrinsic value storage device 53, the CRC intrinsic value storage device 54, and the "0" generator 55.

The operation of the CRC circuit having a configuration as explained above is explained below, respectively, with regard to the encoding, and code error detecting cases.

[When encoding]

Before generating an encoded CRC code, an "L"-level of the reset signal "rest" is applied to the reset signal input terminal 4 of the dividing circuit so that all the content stored in the respective flip flop circuit 2h(2) in the respective storage portion 2h in the all storage devices 2(1)~2(32) are reset, in other words, initialized to "0".

All contents of the storage devices 2(1)~2(32) in the dividing circuit 1 are initialized and then the respective reset signals are set to "H" level.

In this set state as shown by FIG. 6A, data having a plurality of bits in the CRC code word, which is temporarily stored in the encoding/decoding data temporary storage device 51, and "0" information from the "0" generator 55 are provided to the code data input terminal 3 of the dividing circuit 1 in synchronization with the clock signal "clk" shown by FIG. 6B.

Referring to FIG. 5, the data in the CRC code word is inputted into the code data input terminal 3 of the dividing circuit 1 in the order from the first header byte 21a to the fourth header byte 21d in the header portion 21, and the bits are inputted in the order from the 0th bit to the seventh bit. The data portion 22 is then inputted following the header portion 21 in the order from the first byte to the 2048th byte, and in each byte, the bits are inputted from the 0th bit to the seventh bit.

After then, "0" information is inputted in 32 straight bits sequentially from the "0" generator 55.

The data having a plurality of bits in the CRC code word, which is inputted in the order as mentioned above, and "0" information are received by the dividing circuit 1 according to the data input control signal "enbl" which is inputted into the data input control terminal 5 and the clock signal "clk" which is inputted into the clock signal input terminal 6. Then the data having a plurality of bits in the CRC code word is divided by the g(X) and the remainder data resulting of the division is stored in each of the storage devices 2(1)~2(32) in the division circuit 1.

This point is further elaborated as follows. The data input control signal "enbl" which is inputted into the data input control terminal 5 maintains "L" level as long as there is no data dropped in the CRC code word which is inputted into the code data input terminal 3. For example, the signal "enbl" is "L" level in the respective periods for the 0th, first, fourth, and fifth bits of the input data, and in the first clock period of the respective periods for the second and the third input bits. Therefore, the selector 2h(1) in the storage portion 2h in each of the storage devices 2(1)~2(32) selects the outputs from the logic circuit 2g.

Accordingly, during these periods, each of the storage devices 2(1)~2(32) in the dividing circuit 1 operates as a shift register. The respective flip flop circuits 2h(2) in the respective storage portions 2h receive either the output signal via the selector 2h(1) from the respective logic circuit 2g or the information form the first input node 2a, in synchronization with the rising edge of the clock signal "clk" inputted to the clock signal input terminal 6. The respective flip flop circuits 2h(2) temporarily stores the contents therein, and at the same time outputs the data to be stored to the respective corresponding parallel data output terminals 7(1)~7(32).

The logic circuit 2g of the first-stage storage device 2(1) receives the data in the CRC code word and "0" information which are inputted to the code data input terminal 3, and the output from the storage portion 2h of the last-stage storage device 2(32), calculates an exclusive logical sum, and outputs the calculated result to the corresponding storage portion 2h.

The logic circuit 2g in each storage belonging to the first group except the one in the first-stage storage device 2(1) calculates an exclusive logical sum of the output from the storage portion 2h in its preceding storage device and the output from the storage portion 2h of the storage device 2(32) of the last-stage. The logical sum is then outputted to the storage portion 2h in each corresponding storage device.

The storage portion 2h in each storage device belonging to the second group except the one in the first-stage storage device 2(1) receives directly the output from its preceding storage device.

On the other hand, if there is data dropped in the CRC code word which is inputted into the code data input terminal 3, the data input control signal "enbl" which is inputted into the data input control terminal 5 maintains "H" level. For example, the signal "enbl" becomes "H" level in the respective second clock periods corresponding to the second and the third bits in the inputted data, as shown in FIG. 6A and FIG. 6C. The "H"-level data input control signal "enbl" operates so that the selector 2h(1) in the storage portion 2h in the respective storage devices 2(1)~2(32) selects the outputs from the flip flop circuit 2h(2) its own storage portion 2h.

Accordingly, each of the storage devices 2(1)~2(32) its dividing circuit 1 operates so that it maintains its own content stored therein. That is, as shown in FIG. 2, since the flip flop circuit 2h(2) takes-in the output signal which is outputted from output terminal of the own storage portion 2h via the selector 2h(1) in synchronization with the rise of the clock signal which is inputted into the clock signal input terminal 6, the flip flop circuit 2h(2) in each of the storage devices 2(1)~2(32) maintains the stored content.

In this manner, the dividing circuit 1 divides the data in the CRC code word and "0" information and outputs the remainder data as a result of the division to the respective parallel data output terminals 7(1)~7(32) of the dividing circuit 1.

The remainder data which is outputted from the respective parallel data output terminals 7(1)~7(32) is inputted into the input terminal A of the adder 8, which adds the remainder data with the CRC intrinsic value which is inputted to the second input terminal B.

The output from the adder 8 has a value derived from the equation (7), and constitutes a CRC code in the CRC code word for transmission (encoded CRC code). This encoded CRC code is then synthesized with a fixed pattern having a plurality of bits in the corresponding CRC code word and data which is stored in the encoding/decoding data temporary storage device 51, and transmitted to the other systems via the internal bus 57 and the external bus 58 as a CRC code word.

[When a code error is detected]

Before detecting an error in a transmitted CRC code word, an "L"-level of the reset signal "rest" is applied to the reset signal input terminal 4 in the dividing circuit 1 so that all the content stored in the flip flops 2h(2) in the storage portions 2h in the respective storage devices 2(1)~2(32) in the dividing circuit 1 are reset, i.e. initialized to "0".

All the storage devices 2(1)~2(32) in the dividing circuit 1 are initialized, and then respective reset signals are set to "H" level.

On the other hand, the data in the CRC code word which is transmitted via the external bus 58 and the internal bus 57 is temporarily stored in the encoding/decoding data temporary storage device 51, and the CRC code in the CRC code word is temporarily stored in the encoding CRC code temporary storage device 52.

As shown in FIG. 6A, in the "set" state of the respective storage devices 2(1) 2(32), the CRC code word except a fixed pattern 10, i.e. the data having a plurality of bits in the CRC code word which is temporarily stored in the encoding/decoding data temporary storage device 51, and the CRC code in the CRC code word which is temporarily stored in the CRC code temporary storage device 52 are provided to the code data input terminal 3 of the dividing circuit 1 in synchronization with the clock signal "clk" shown by FIG. 6B.

Referring to FIG. 5, the data, except a fixed pattern 10, in the CRC code word is inputted into the code data input terminal 3 of the dividing circuit 1 in the order from the first header byte 21a to the fourth header byte 21d of the header portion 21, and the bits are inputted in the order from the 0th bit to the seventh bit. The data portion 22 is then inputted following the header portion 21 in the order from the first byte to the 2048th byte, and in each byte, the bits are inputted from the 0th bit to the seventh bit. Furthermore, the CRC detection signal is inputted in the order from the first byte CRC detection signal 30a to the fourth byte detection signal 30d, and in each byte, the bits are inputted from the 0th bit to the seventh bit.

The CRC code word except a fixed pattern 10, which is inputted in the order as mentioned above, is received by the dividing circuit 1 according to the data input control signal "enbl" which is inputted into the data input control terminal 5 and the clock signal "clk" which is inputted into the clock signal input terminal 6. The CRC code word is then divided by g(X) and the remainder data resulting from the division is outputted from each of the parallel data terminals 7(1)~7(32) in the division circuit 1, in the same manner as the encoding process.

The remainder data outputted from the respective parallel data output terminals 7(1)~7(32) of the dividing circuit 1 is inputted to the first input terminal A of the adder 8 which adds the inputted remainder data with the CRC intrinsic value which is inputted to the second input terminal B.

The output from adder 8 has a value which is derived from the equation (11). The output resulting from the addition is then inputted to the logical sum circuit 9, where a logical sum is calculated.

If there is no error in the received CRC code word, the resulting sum from the adder 8 is 0. The logical sum circuit 9 then outputs a CRC flag indicating no error in the CRC code word. In this case, the decoded CRC code polynomial DC(X), which is a sum, is 0, in other words the decoded CRC code is 0.

As a result, the encoding/decoding system 56 performs the succeeding processing after confirming no error in the received CRC code word.

If there is an error in the received CRC code word, at least one bit in the sum from the adder 8 shows 1. The logical sum circuit 9 then outputs a CRC flag indicating that the CRC code word contains an error. In this case, the decoded CRC code polynomial DC(X), which is a sum, has a value other than 0, in other words, the decoded CRC code is other than 0.

As a result, the encoding/decoding system 56 recognizes that there is an error in the received CRC code word and stops the succeeding processing. The CRC code in the CRC code word is corrected by using the decoded CRC code outputted from the adder 8.

In the CRC circuit having a configuration as mentioned above, when encoding, the CRC code word is obtained by adding the remainder data, which is based on the data in the CRC code word whose bit number is less than the total number of the CRC code words and the "0" information having a plurality of bits, with the CRC intrinsic value. The CRC intrinsic value is influenced by the content of the fixed pattern 10 and the respective code lengths of the data 20 and the CRC code 30, but not influenced by the respective contents of the data 20 and the CRC code 30. Accordingly, it speeds up the generation of a CRC code, since the CRC code is obtained without inputting the fixed pattern 10 to the dividing circuit I (this effect is referred to as a first effect, hereinafter).

Moreover in the CRC circuit mentioned above, when a code error is detected, a CRC flag (an error detection signal) is obtained by adding the remainder data which is based on the division result of the CRC code word except the fixed pattern with the CRC intrinsic value, and calculating a logical sum of the resulting sum. Accordingly, it speeds up the detection of an error in a CRC code word, since the CRC flag is obtained without inputting the fixed pattern 10 to the dividing circuit 1 (this effect is referred to as a second effect, hereinafter).

Furthermore, in a CRC circuit as mentioned above, each of the storage devices 2(1)~2(32) operates selectively as a shift register, or as a storage device for maintaining the content stored therein. Accordingly, even if the data is inputted intermittently, for example, as shown in FIG. 6A, the dividing circuit 1 performs the division accurately (this effect is referred to as a third effect, hereinafter).

Figure 7:
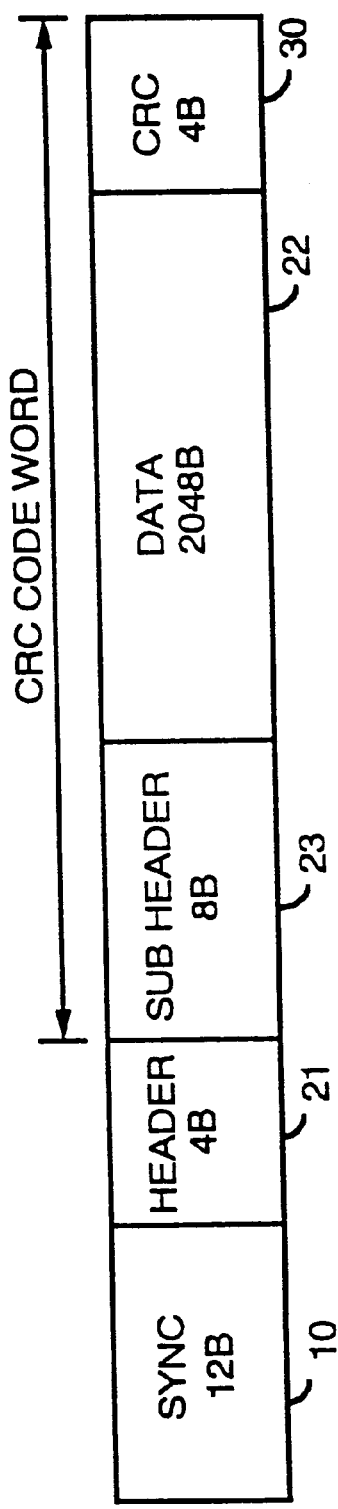
FIG. 7 is a data format diagram showing a CRC code word in the CD-ROM MODE 2 applied to the present invention.

The above-mentioned CRC circuit is also applicable to a CRC code word in the CD-ROM MODE 2 as shown in FIG. 7, just in the same way as the CRC code word in the CD-ROM MODE 1 as shown in FIG. 4 and FIG. 5.

A CRC code word in the CD-ROM MODE 2 comprises a data 20 comprising sub header portion 23 having 8 bytes and a data portion 22 having 2048 -bytes, and a CRC code 30 having 4 bytes. A fixed pattern 10 having 12 bytes is not included in the CRC code word.

In this case, when encoding, the CRC code word is inputted sequentially in the order of the 8-byte sub header portion 23, 2048-byte data portion 22, and 4-byte "0" information, in the same manner as mentioned above, to the dividing circuit 1. The CRC code word is divided by g(X) and the remainder data resulting from the division is added with the CRC intrinsic value in the adder 8 to obtain an encoded CRC code.

When a code error is detected, the CRC code word is inputted sequentially in the order of the 8-byte sub header portion 23, 2048-byte data portion 22, and 4-byte CRC code 300, in the same manner as mentioned above, to the dividing circuit 1. The CRC code word is divided by g(X) and the remainder data resulting from the division is added with the CRC intrinsic value in the adder 8, and the resulting from is further inputted to the logical sum circuit 9, where a logical sum is calculated, which is outputted as a CRC flag.

In the CRC circuit having a configuration as mentioned above, the data can be inputted using a plurality of bit widths to the dividing circuit 1, although in the above description, the data is inputted serially using one bit from the code data input terminal 3 to the dividing circuit 1. The present invention is not restricted to a particular method for inputting a CRC code word to the dividing circuit 1 or a particular configuration of a dividing circuit 1, as long as the dividing circuit 1 provides remainder data by dividing the CRC code word data by the generation polynomial g(X) of the CRC code word.

Embodiment 2

Figure 8:
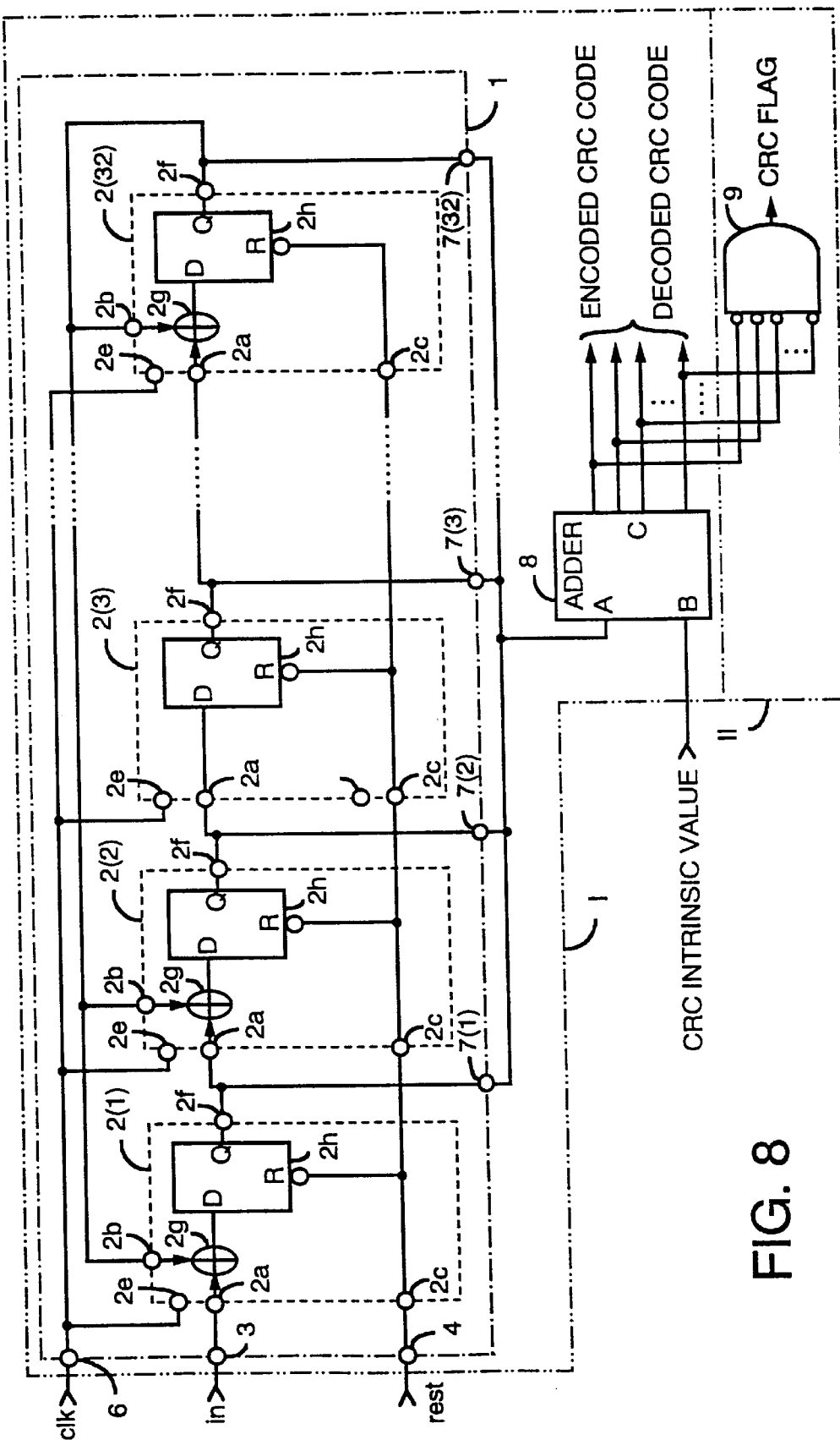
FIG. 8 is a circuit configuration diagram showing a second embodiment of the present invention.
Figure 9:
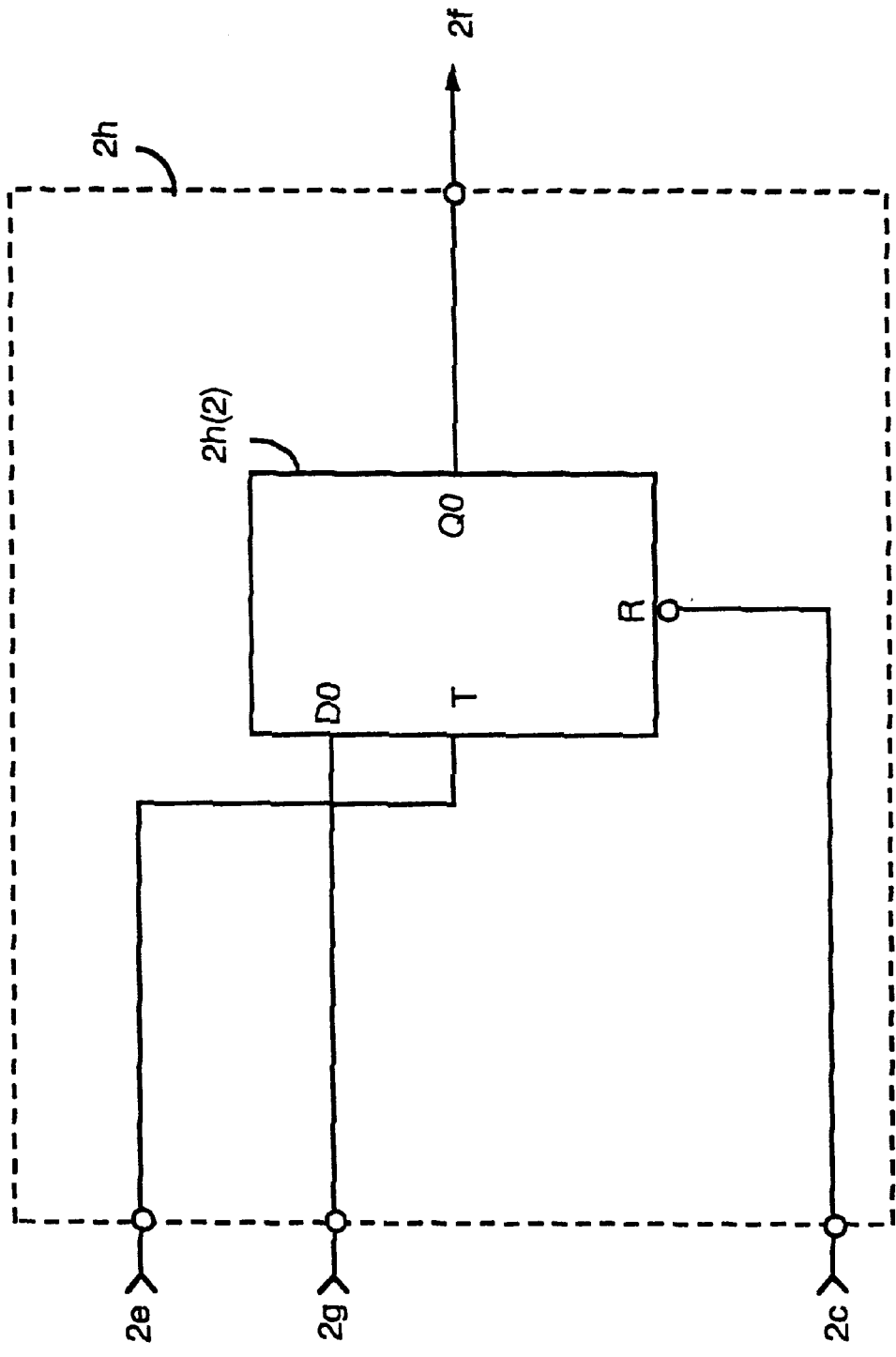
FIG. 9 is a block diagram showing a storage portion 2h in each of the storage devices 2(1)~2(32) according to the second and fourth embodiments of the present invention.

FIG. 8 and FIG. 9 respectively show a second embodiment which is the same as the first embodiment except for the following points.

In the first embodiment, as described above, each of the storage devices 2(1)~2(32) consists of a storing circuit which comprises a selector 2h(1) and a flip flop 2h(2) so that each storage device operates selectively as a shift register or as a storage device for maintaining the content stored therein, according to the data input control signal (enable signal) enbl. On the other hand, in the second embodiment, each of the storage devices 2(1)~2(32) consists of a storing circuit which comprises only a flip flop circuit 2h(2), and no selector 2h(1), as shown in FIG. 9. Furthermore, in the second embodiment, the input node D of the flip flop 2h(2) directly receives the output signal from the logic circuit 2g or the output signal from the first input node 2a.

With regard to the points except those mentioned above, the configuration of the second embodiment is similar to that of the first embodiment.

In FIG. 8 and FIG. 9, like reference numerals refer the same portions as or corresponding portions to those presented in FIG. 1.

Even in a CRC circuit having a configuration as mentioned in the second embodiment, the dividing circuit 1 outputs remainder data by performing division in the same manner as that of the first embodiment, as long as the encoding input data and an error detection input data, which are inputted to the dividing circuit 1, are inputted to the code data input terminal 3 in the manner that the next bit of data is inputted at the rising edge of the clock signal "clk" which is inputted to the clock signal input terminal 6.

If encoded input data and input data during error detection inputted to the dividing circuit 1 do not include an intermittent data at the code data input terminal 3, the same clock signal "clk" used in the first embodiment is also applicable to the second embodiment. If an intermittent data including dropped data is inputted to the code data input terminal 3 of the dividing circuit 1, a clock signal which rises at the next bit time of the CRC code word is inputted to the clock signal input terminal 6.

Accordingly, in the CRC circuit having a configuration as mentioned in the second embodiment, it is also possible to obtain the first and the second effects as explained in the first embodiment.

Embodiment 3

Figure 10:
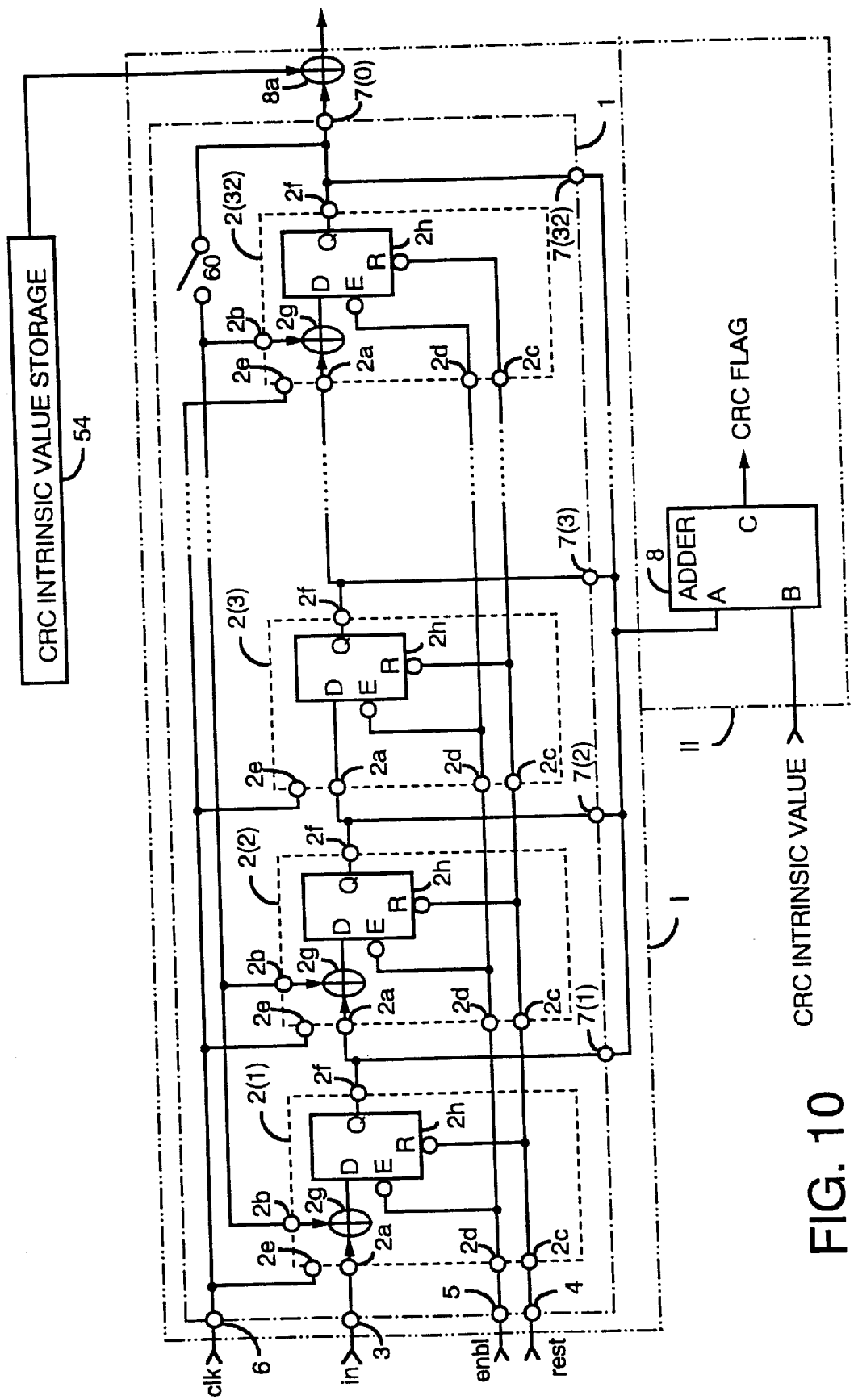
FIG. 10 is a circuit configuration diagram showing a third embodiment of the present invention.

FIG. 10 shows a third embodiment which is the same as the first embodiment except for the following points. A first different point is that, the dividing circuit 1 comprises a serial data output terminal 7(0) for serially outputting remainder data for every bit, other than the parallel data output terminals 7(1)~7(32). The serial data output terminal 7 (0) is connected to the output node 2f of the last-stage storage device 2(32).

A second different point is that, the serial data output terminal (0) and a first switching circuit 60 are further added to the dividing circuit 1. The first switching circuit 60 is arranged between the output node 2f of the storage device 2(32) in the last stage and the respective second input nodes 2b of the seven storage device belonging to the first group, i.e. the storage devices 2(1), 2(2), 2(4), 2(5), 2(16), 2(17) and 2(32) in the respective first, second, fourth, fifth, sixteenth, seventeenth, and thirty second stages, in case of the third embodiment. When switching the first switching circuit 60 to ON state, the output node 2f in the storage device 2(32) in the last stage and the respective input nodes 2b in the storage device belonging to the first group becomes a conductive state (hereinafter, referred to as "on" state), when the dividing circuit 1 performs division. When the remainder data is outputted from the serial data output terminal 7(0), the first switching circuit 60 provides "0" information to the respective second input nodes 2b in the storage device belonging to the first group (hereinafter, referred to as "off" state).

A third different point is that, since a division result is serially outputted for every bit from the serial data output terminal 7(0), the adder 8a for outputting a encoded CRC code and a decoded CRC code adds the remainder data from the serial data output terminal 7(0) of the dividing circuit 1 for every bit with the CRC intrinsic value which is serially inputted, and outputted serially for every bit.

The adder 8a consists of an exclusive logical sum circuit in this third embodiment.

The fourth different point is that, since the CRC intrinsic value is inputted by a bit unit to the adder 8a, a CRC intrinsic value storage device 54 can output a CRC intrinsic value in parallel, and also serially.

The fifth different point is that, a flag output circuit consists of a comparator 9a which, when encoding, compares the remainder data from the parallel data output terminals 7(1)~7(32) in the dividing circuit 1 with the CRC intrinsic value outputted in parallel from the CRC intrinsic value storage device 54 so that the comparison result is outputted as a CRC flag. The remaining portions are the same as those in the first embodiment. In FIG. 10, like reference numerals refer to the same portions as and corresponding portions to those presented in FIG. 1.

The operation of a CRC circuit having a configuration as mentioned above is explained respectively with regard to a time when encoding, and when code-error detecting.

[When encoding]

Before generating an encoded CRC code, an "L"-level of the reset signal "rest" is applied to the reset signal input terminal 4 of the dividing circuit so that all the content stored in the respective flip flop circuit 2h(2) in the respective storage portion 2h in the all storage devices 2(1)~2(32) are reset, in other words, initialized to "0". The first switching circuit 60 is set to the "on" state.

All the storage devices 2(1)~2(32) in the dividing circuit 1 are initialized and the respective reset signals are set to "H" level.

In this set state as shown by FIG. 6A, data having a plurality of bits in the CRC code word, which is temporarily stored in the encoding/decoding data temporary storage device 51, and "0" information from the "0" information generator 55 are provided to the code data input terminal 3 of the dividing circuit 1 in synchronization with the clock signal "clk" shown by FIG. 6B. The data having a plurality of bits in CRC code word is inputted into the code data input terminal 3 of the dividing circuit 1, in the same manner as mentioned in the first embodiment.

The data in the CRC code word, and "0" information, which are inputted in the manner as mentioned above, is taken-in in the dividing circuit 1 according to the data input control signal "enbl" which is inputted into the data input control terminal 5 and the clock signal "clk" which is inputted into the clock signal input terminal 6. Then the data having a plurality of bits in the CRC code word is divided by the g(X) and the remainder data resulting from the division is stored in each of the storage devices 2(1)~2(32) in the division circuit 1, in the same manner as mentioned in the first embodiment.

The first switching means 60 becomes "off" state when all the data in the CRC code word is inputted and the dividing circuit 1 completes the division.

As a result, "0" information is provided to the respective second input nodes 2b of the seven storage devices 2(1), 2(2), 2(4), 2(5), 2(16), 2(17), 2(32) in the respective first, second, fourth, fifth, sixteenth, seventeenth, and thirty second stages.

Accordingly, the logic circuit 2g in the respective storage device belonging to the first group passes the information inputted to the first input node 2a on to the storage portion 2h.

Accordingly, the dividing circuit 1 operates as a shift register for transmitting the content stored in the respective storage devices 2(1)~2(32) sequentially for every bit in synchronization with the clock signal "clk" which is inputted to the clock signal input terminal 6 so that the remainder data is outputted serially for every bit from the serial data output terminal 7(0).

The data in the CRC code word and "0" information are divided by g(X) at the dividing circuit 1, and the remainder data as a result of the division is outputted from the serial data output terminal 7(0) of the dividing circuit 1.

The remainder data outputted from the serial data output terminal 7(0) of the dividing circuit 1 is inputted into one of the input terminals of the adder 8a, and added with the CRC intrinsic value for every bit, which is inputted from the other input terminal.

The output from adder 8 has a value derived from the equation (7), and constitutes a CRC code in the CRC code word for transmission (encoded CRC code). This encoded CRC code is then synthesized with a fixed pattern of a plurality of bits in the corresponding CRC code word and a data which is stored in the encoding/decoding data temporary storage device 51, and transmitted to the other systems via the internal bus 57 and the external bus 58 as a CRC code word.

[When a code error is detected]

Before detecting an error in a CRC code word to be transmitted, an "L-level of the reset signal "rest" is applied to the reset signal input terminal 4 in the dividing circuit 1 so that all the content stored in the flip flops 2h(2) in the storage portions 2h in the respective storage devices 2(1)~2(32) in the dividing circuit 1 are reset, i.e. initialized to "0". And the first switching means 60 are set to ON state. All the storage devices 2(1)~2(32) in the dividing circuit 1 are initialized, and then respective reset signals are set to "H" level.

On the other hand, the data in the CRC code word which is transmitted via the outside bus 58 and the inside bus 57 is temporarily stored in the encoding/decoding data temporary storage device 51, and the CRC code in the CRC code word is temporarily stored in the encoding CRC code temporary storage device 52.

As shown by FIG. 6A, in the "set" state of the respective storage devices 2(1)~2(32), the CRC code word except a fixed pattern 10, i.e. the data having a plurality of its in the CRC code word which is temporarily stored in the encoding/decoding data temporary storage device 51, and the CRC code in the CRC code word which is temporarily stored in the CRC code temporary storage device 52 are provided to the code data input terminal 3 of the dividing circuit 1 in synchronization with the clock signal "clk" as shown by FIG. 6B. The data having CRC code word is inputted into the code data input terminal 3 of the dividing circuit 1, in the same manner as mentioned in the first embodiment.

The data in the CRC code word except a fixed pattern 10 is received in the dividing circuit 1, in the same manner as described in the above encoding processing, according to the data input control signal "enbl" which is inputted into the data input control terminal 5 and the clock signal "clk" which is inputted into the clock signal input terminal 6. Then the data having the CRC code word is divided by the g(X) and the remainder data as a result of the division is stored in each of the storage devices 2(1)~2(32) in the division circuit 1.

The remainder data stored in the respective storage devices 2(1)~2(32) in the dividing circuit 1 is outputted from the respective parallel data output terminals 7(1)~7(32). This outputted remainder data is then inputted to the first input terminal A1 of a comparator 9a.

In the comparator 9a, the remainder data inputted into the first input terminal A1 and a CRC intrinsic value inputted input the second input terminal B1 are compared for every bit. In case of the third embodiment, if all the bits of remainder data and a CRC intrinsic value are equal to each other, the comparator 9a outputs an "H"-level of the comparison result signal (CRC flag) which indicates that the CRC code word contains no error. If any one of the bits of the remainder data and a CRC intrinsic value is not equal to each other, the comparator 9a outputs an "L"-level of the comparison result signal (CRC flag) which indicates that the CRC code word contains an error.

In other words, if there is no error in a CRC code word, the remainder data (the second term in the right member of the equation (11)) and the CRC intrinsic value (the first term in the right member of the equation (11)) have the same value since the decoded CRC code polynomial DC(X) in the equation (11) is 0. Accordingly, the comparator 9a outputs a matching signal.

If the comparator 9a outputs a CRC flag indicating no error in the CRC code word, the encoding/decoding system 56 performs the succeeding processing after confirming no error in the received CRC code word.

If the comparator 9a outputs a CRC flag indicating an error in the CRC code word, the encoding/decoding system 56 stops the succeeding processing after it confirms that the received CRC code word contains an error. Further, the first switching circuit 60 then is set to "off" state, and as mentioned in the encoding processing, the dividing circuit 1 operates as a serial register so that the remainder data is outputted from the serial data output terminal 7(0) serially, and the CRC intrinsic value is provided to the adder 8a serially from the CRC intrinsic value storage device 54.

As a result, since the comparator 9a outputs a decoded CRC code which is not 0, the CRC code in the CRC code word is corrected by using the outputted decoded CRC code.

Accordingly, in the CRC circuit having a configuration as mentioned above, the first, second, and third effects as mentioned in the first embodiment are obtained.

Moreover, since the data from the parallel data output terminals 7(1)~7(32) of the dividing circuit 1 and the CRC intrinsic value are compared in the comparator 9a to output a CRC flag, it speeds up the detection of an error in a CRC code word (fourth effect).

Furthermore, if a CRC flag indicates that the CRC code word contains an error when a code error is detected, a decoded CRC code for an error is obtained from the adder 8a (the fifth effect, hereinafter).

Embodiment 4

Figure 11:
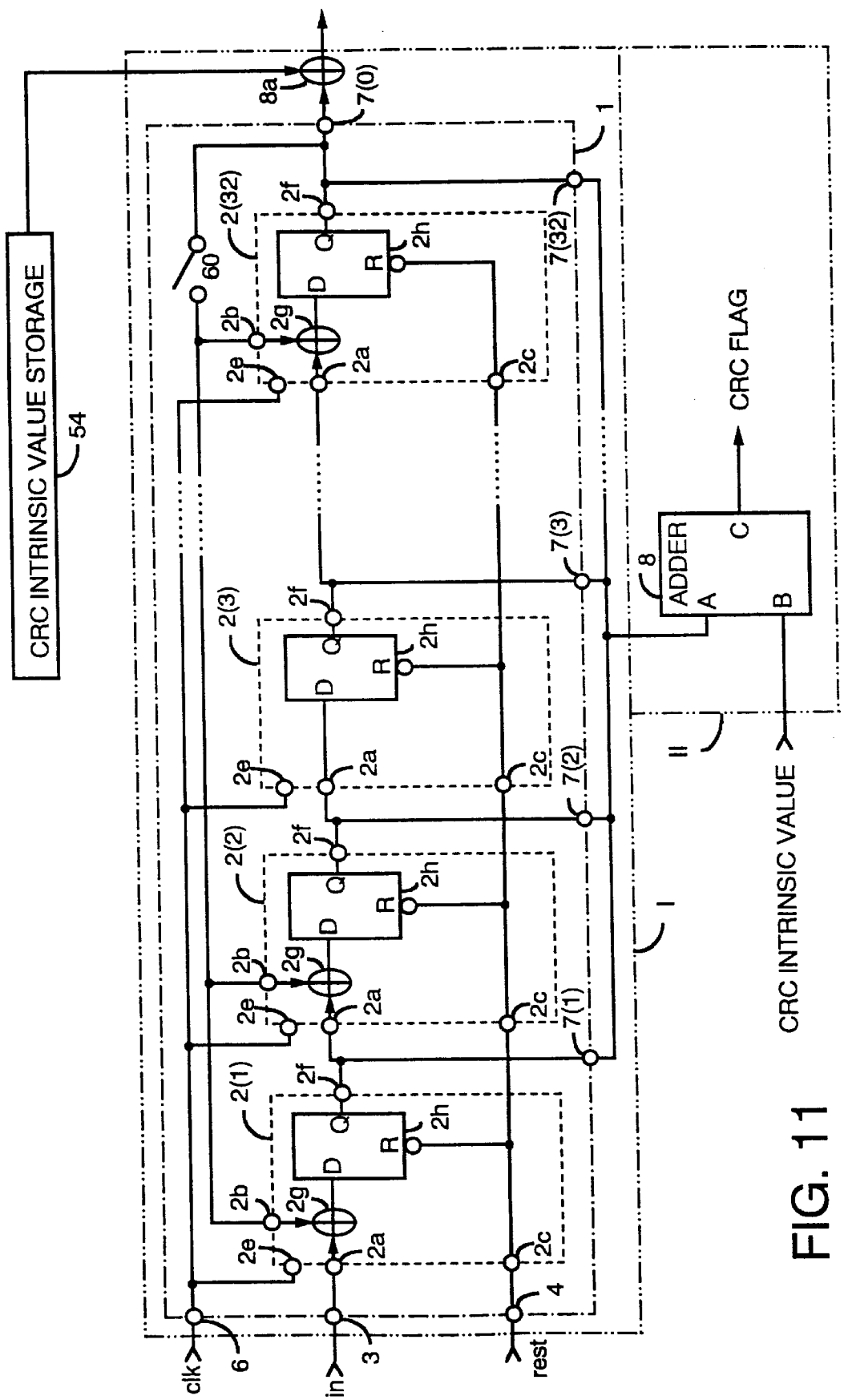
FIG. 11 is a circuit configuration diagram showing a fourth embodiment of the present invention.

FIG. 11 shows a fourth embodiment which is the same as the third embodiment except for the following points.

As shown in the third embodiment, each of the storage devices 2(1)~2(32) consists of a storing circuit which comprises a selector 2h(1) and a flip flop 2h(2). Each storage device 2(1)~2(32) operates selectively as a shift register or as a storage device for maintaining the content stored therein, according to the data input control signal (enable signal) enbl.

On the other hand, in the fourth embodiment, similar to the second embodiment, each of the storage devices 2(1)~2(32) consists of a storing circuit which comprises only a flip flop circuit 2h(2), and no selector 2h(1), as shown in FIG. 9. Furthermore, in the fourth embodiment, the input node D of the flip flop 2h(2) directly receives the output from the logic circuit 2g or the output from the first input node 2a.

With regard to the points except those mentioned above, the configuration of the fourth embodiment is similar to that of the third embodiment.

In FIG. 11, the same reference numbers are attached to the same portions as or corresponding portions as in FIG. 1 and FIG. 10.

Even in a CRC circuit having a configuration as mentioned in the fourth embodiment, the dividing circuit 1 outputs remainder data by performing division in the same manner as that of the third embodiment, as long as the encoding input data and the error detection input data, which are inputted to the dividing circuit 1, are inputted to the encode data input terminal 3 in the similar manner to the third embodiment.

Accordingly, in the CRC circuit having a configuration as mentioned in the fourth embodiment, it is possible to obtain the first and the second effects as explained in the first embodiment, as well as the fourth and the fifth effects as explained in the third embodiment.

What is claimed is:

1. A CRC circuit for generating CRC codes and detecting code errors comprising:

a dividing circuit for, when encoding:

for receiving data having a plurality of bits in a CRC code word and "0" information having r bits, r being an integer larger than 1, input from a data input terminal, the CRC code word comprising a fixed pattern of a plurality of bits and a CRC code of r bits, said dividing circuit for dividing the input data and the "0" information by a generation polynomial q(X) of a CRC code word, and outputting a result of the division from r parallel data output terminals of said dividing circuit as a remainder having r bits, and, when detecting code errors:

for receiving data having a plurality of bits and a CRC code of r bits of a CRC code word input from the data input terminal, dividing the CRC code word by a generation polynomial g(X) of a CRC code word, and outputting a remainder having r bits resulting from the division from r parallel data output terminals of said dividing circuit, wherein said dividing circuit comprises storage means having r-stages corresponding to r parallel data output terminals, wherein respective r-stage storage means are in either a first group or a second group according to the generation polynomial g(X) of the CRC code word, each of said storage means in the first group comprises:

a first input node, a second input node, and an output node connected to a corresponding one of the parallel data output terminals;

a logic circuit for calculating an exclusive logical sum of the data input respectively to the first and second input nodes; and a storage portion comprising an input node A0 for receiving an output from the logic circuit, an input node B0, an output node C0, and a selective input node, and a selector for outputting either data input from the input node A0 or data input from the input node B0, to the output node C0 according to a data input control signal input to the selective input node, and a storing circuit for receiving an output from the output node C0 of the selector in synchronization with an input clock signal, for storing the received content, and for outputting the content to the output node and the input node B0 of the selector; and each of said storage means in the second group comprises:

a first input node and an output node connected to a corresponding one of the parallel data output terminals; and a storage portion comprising an input node A0 for receiving data input to the first node, an input node B0, an output node C0, and a selective input node, and a selector for outputting either data input from the input node A0 or data input from the output node B0, to the output node C0 according to a data input control signal input to the selective input node, and a storing circuit for receiving an output from the output node C0 of the selector in synchronization with an input clock signal, for storing the received content, and for outputting the content to the output node and the input node B0 of the selector, wherein said first input node of said first-stage storage means is connected to the data input terminal, said first input node of each remaining stage of said storage means is connected to an output node of said storage means in a preceding stage, and said second input node of each storage means in the first group is connected to the output node of a last-stage storage means;

an adder for adding the remainder from the r parallel data output terminals of said dividing circuit and a CRC intrinsic value, the CRC intrinsic value being derived from the fixed pattern and code lengths of a data portion and a CRC code portion of the CRC code word to produce a sum, and, when encoding, for outputting the sum as an encoded CRC code corresponding to the data input to the data input terminal of said dividing circuit; and a logical sum circuit for calculating a logical sum of the sum from said adder and outputting the logical sum as a CRC flag when a code error is detected.

2. A CRC circuit for generating CRC codes and detecting code errors comprising:

a dividing circuit for, when encoding:

receiving data having a plurality of bits in a CRC code word and "0" information of r bits, r being an integer larger than 1, input from a data input terminal, the CRC code word comprising a fixed pattern of a plurality of bits and a CRC code of r bits, for dividing the input data and the "0" information by a generation polynomial g(X) of a CRC code word, and for outputting a result of the division from r parallel data output terminals of said dividing circuit as a remainder having r bits, and, for, when detecting code errors:

receiving data having a plurality of bits and a CRC code having r bits of a CRC code word input from the data input terminal, dividing the CRC code word by a generation polynomial g(X) of a CRC code word, and outputting a remainder having r bits resulting from the division from r parallel data output terminals of said dividing circuit, wherein said dividing circuit comprises storage means having r-stages corresponding to r parallel data output terminals, wherein respective r-stage storage means are in either a first group or a second group according to the generation polynomial g(X) of the CRC code word, each of said storage means in the first group comprises:

a first input node, a second input node, and an output node connected to a corresponding one of the parallel data output terminals;

a logic circuit for calculating an exclusive logical sum of the data input respectively to the first and second input nodes; and a storage portion comprising an input node A0 for receiving an output from the logic circuit, an input node B0, an output node C0, and a selective input node, and a selector for outputting either data input from the input node A0 or data input from the input node B0, to the output node C0 according to a data input control signal input to the selective input node, and a storing circuit for receiving an output from the output node C0 of the selector in synchronization with an input clock signal, for storing the received content, and for outputting the content to the output node and the input node B0 of the selector; and each of said storage means in the second group comprises:

a first input node and an output node connected to a corresponding one of the parallel data output terminals; and a storage portion comprising an input node A0 for receiving data input to the first node, an input node B0, an output node C0, and a selective input node, and a selector for outputting either data input from the input node A0 or data input from the output node B0, to the output node C0 according to a data input control signal input to the selective input node, and a storing circuit for receiving an output from the output node C0 of the selector in synchronization with an input clock signal, for storing the received content, and for outputting the content to the output node and the input node B0 of the selector, wherein said first input node of said first-stage storage means is connected to the data input terminal, said first input node of each remaining stage of said storage means is connected to an output node of said storage means in a preceding stage, and said second input node of each storage means in the first group is connected to the output node of a last-stage storage means;

an adder for adding the remainder from a serial data output terminal of said dividing circuit and a CRC intrinsic value derived from the fixed pattern and code lengths of a data portion and the CRC code portion of the CRC code word to produce a sum and, when encoding, for serially outputting the sum as an encoded CRC code for the data input to the data input terminal of said dividing circuit; and a comparator for, when detecting code errors, comparing the CRC intrinsic value and the remainder from the dividing circuit to output a comparison result as a CRC flag.

3. A CRC circuit for generating CRC codes and detecting code errors, the CRC circuit comprising:

a dividing circuit for, when encoding:

receiving data having a plurality of bits in a CRC code word and "0" information of r bits, r being an integer larger than 1, input from a data input terminal, the CRC code word comprising a fixed pattern of a plurality of bits and a CRC code of r bits, for dividing the input data and the "0" information by a generation polynomial g(X) of a CRC code word, and for outputting a result of the division from r parallel data output terminals of said dividing circuit as a remainder having r bits, and, for, when detecting code errors:

receiving data having a plurality of bits and a CRC code having r bits of a CRC code word input from the data input terminal, dividing the CRC code word by a generation polynomial g(X) of a CRC code word, and outputting a remainder having r bits resulting from the division from r parallel data output terminals of said dividing circuit, wherein said dividing circuit comprises storage means having r-stages corresponding to r parallel data output terminals, wherein respective r-stage storage means are in either a first group or a second group according to the generation polynomial g(X) of the CRC code word, each of said storage means in the first group comprises:

a first input node, a second input node, and an output node connected to a corresponding one of the parallel data output terminals;

a logic circuit for calculating an exclusive logical sum of the data input respectively to the first and second input nodes; and a storage portion comprising an input node A0 for receiving an output from the logic circuit, an input node B0, an output node C0, and a selective input node, and a selector for outputting either data input from the input node A0 or data input from the input node B0, to the output node C0 according to a data input control signal input to the selective input node, and a storing circuit for receiving an output from the output node C0 of the selector in synchronization with an input clock signal, for storing the received content, and for outputting the content to the output node and the input node B0 of the selector; and each of said storage means in the second group comprises:

a first input node and an output node connected to a corresponding one of the parallel data output terminals; and a storage portion comprising an input node A0 for receiving data input to the first node, an input node B0, an output node C0, and a selective input node, and a selector for outputting either data input from the input node A0 or data input from the output node B0, to the output node C0 according to a data input control signal input to the selective input node, and a storing circuit for receiving an output from the output node C0 of the selector in synchronization with an input clock signal, for storing the received content, and for outputting the content to the output node and the input node B0 of the selector, wherein said first input node of said first-stage storage means is connected to the data input terminal, said first input node of each remaining stage of said storage means is connected to an output node of said storage means in a preceding stage, and the output node of a last-stage storage means is connected to the serial data output terminal;

first switching means arranged between the output node of the last-stage storage means and the second input nodes of the respective storage means in the first group, for connecting the output node of the last-stage storage means and the second input nodes of the respective storage means in the first group while said dividing circuit performs division, and for providing "0" information with the second input nodes of the respective storage means in the first group when remainder data is output from the serial data output terminal;

adder for adding the remainder from a serial data output terminal of said dividing circuit and a CRC intrinsic value derived from the fixed pattern and code lengths of a data portion and the CRC code portion of the CRC code word to produce a sum and, when encoding, for serially outputting the sum as an encoded CRC code for the data input to the data input terminal of said dividing circuit; and a comparator for, when detecting code errors, comparing the CRC intrinsic value and the remainder from the dividing circuit to output a comparison result as a CRC flag.

4. A CRC circuit for generating CRC codes and detecting code errors comprising:

a dividing circuit for, when encoding:

receiving data having a plurality of bits in a CRC code word and "0" information of r bits, r being an integer larger than 1, input from a data input terminal, the CRC code word comprising a fixed pattern of a plurality of bits and a CRC code of r bits, for dividing the input data and the "0" information by a generation Polynomial g(X) of a CRC code word, and for outputting a result of the division from r parallel data output terminals of said dividing circuit as a remainder having r bits, and, for, when detecting code errors:

receiving data having a plurality of bits and a CRC code having r bits of a CRC code word input from the data input terminal, dividing the CRC code word by a generation polynomial g(X) of a CRC code word, and outputting a remainder having r bits resulting from the division from r parallel data output terminals of said dividing circuit, wherein said dividing circuit comprises storage means having r-stages corresponding to r parallel data output terminals wherein respective r-stage storage means are in either a first group or a second group according to the generation polynomial g(X) of the CRC code word, each of said storage means in the first group comprises:

a first input node, a second input node, and an output node connected to a corresponding one of the parallel data output terminals;

a logic circuit for calculating an exclusive logical sum of the data input respectively to the first and second input nodes; and a storage portion comprising an input node A0 for receiving an output from the logic circuit, an input node B0, an output node C0, and a selective input node, and a selector for outputting either data input from the input node A0 or data input from the input node B0, to the output node C0 according to a data input control signal input to the selective input node, and a storing circuit for receiving an output from the output node C0 of the selector in synchronization with an input clock signal, for storing the received content, and for outputting the content to the output node and the input node B0 of the selector; and each of said storage means in the second group comprises:

a first input node and an output node connected to a corresponding one of the parallel data output terminals; and a storage portion comprising an input node A0 for receiving data input to the first node, an input node B0, an output node C0, and a selective input node, and a selector for outputting either data input from the input node A0 or data input from the output node B0, to the output node C0 according to a data input control signal input to the selective input node, and a storing circuit for receiving an output from the output node C0 of the selector in synchronization with an input clock signal, for storing the received content, and for outputting the content to the output node and the input node B0 of the selector, wherein said first input node of said first-stage storage means is connected to the data input terminal, said first input node of each remaining stage of said storage means is connected to an output node of said storage means in a preceding stage, and the output node of a last-stage storage means is connected to the serial data output terminal;

first switching means arranged between the output node of the last-stage storage means and the second input nodes of the respective storage means in the first group, for connecting the output node of the last-stage storage means and the second input nodes of the respective storage means in the first group while said dividing circuit performs division, and for providing "0" information with the second input nodes of the respective storage means in the first group when remainder data is output from the serial data output terminal;

an adder for adding the remainder from a serial data output terminal of said dividing circuit and a CRC intrinsic value derived from the fixed pattern and code lengths of a data portion and the CRC code portion of the CRC code word to produce a sum and, when encoding, for serially outputting the sum as an encoded CRC code for the data input to the data input terminal of said dividing circuit; and a comparator for, when detecting code errors, comparing the CRC intrinsic value and the remainder from the dividing circuit to output a comparison result as a CRC flag, wherein, when a code error is detected, said dividing circuit serially outputs the remainder of r bits from the serial data output terminal, if a CRC flag output from the comparator indicates that there is an error in the CRC code word for the data input from the data input terminal of said dividing circuit, and, when a code error is detected, said dividing circuit serially outputs a sum as a decoded CRC code in the CRC code word for data input from the data input terminal of said dividing circuit.

* * * * *

UNITED STATES PATENT AND TRADEMARK OFFICE
CERTIFICATE OF CORRECTION

PATENT NO. : 5,898,712
DATED : April 27, 1999
INVENTOR(S) : KODAMA et al.

It is certified that error appears in the above-identified patent and that said Letters Patent is hereby corrected as shown below:

Column 21, line 10, delete "for";

line 16, change "q(X)" to --g(X)--;

line 21, delete "for";

line 63, change "output" (first occurrence) to --input--.

Column 23, line 14, change "output" (first occurrence) to --input--.

Column 24, line 31, change "output" (first occurrence) to --input--;

line 56, before "adder" insert --an--.

Column 25, line 10, change "Polynomial" to --polynomial--.

UNITED STATES PATENT AND TRADEMARK OFFICE
CERTIFICATE OF CORRECTION

PATENT NO. : 5,898,712
DATED : April 27, 1999
INVENTOR(S) : KODAMA et al.

It is certified that error appears in the above-identified patent and that said Letters Patent is hereby corrected as shown below:

Column 26, line 4, change "output" (first occurrence) to --input--.

Signed and Sealed this

Eleventh Day of January, 2000

Q. TODD DICKINSON

*Attest:*

*Attesting Officer*  *Acting Commissioner of Patents and Trademarks*